US012599038B2

(12) United States Patent
Cho et al.

(10) Patent No.: US 12,599,038 B2
(45) Date of Patent: Apr. 7, 2026

(54) DISPLAY DEVICE WITH A HEAT DISSIPATION SUBSTRATE AND A COVER SUBSTRATE

(71) Applicant: Samsung Display Co., LTD., Yongin-si (KR)

(72) Inventors: Joo Woan Cho, Seongnam-si (KR); Byung Choon Yang, Seoul (KR); Tae Hee Lee, Hwaseong-si (KR); Byeong Hwa Choi, Seoul (KR); Hae Yun Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 721 days.

(21) Appl. No.: 17/821,118

(22) Filed: Aug. 19, 2022

(65) Prior Publication Data

US 2023/0069296 A1 Mar. 2, 2023

(30) Foreign Application Priority Data

Aug. 24, 2021 (KR) ........................ 10-2021-0111703

(51) Int. Cl.
*H01L 25/18* (2023.01)
*H01L 23/00* (2006.01)
(Continued)

(52) U.S. Cl.
CPC .......... *H01L 25/18* (2013.01); *H01L 23/4006* (2013.01); *H01L 23/552* (2013.01);
(Continued)

(58) Field of Classification Search
CPC . H01L 2224/05026; H01L 2224/05073; H01L 2224/05082; H01L 2224/05111;
(Continued)

(56) References Cited

U.S. PATENT DOCUMENTS 11,678,502 B2 6/2023 Lee et al.
2003/0155516 A1* 8/2003 Spartiotis .............. G01T 1/2928
250/370.09
(Continued)

FOREIGN PATENT DOCUMENTS

CN 212810335 U 3/2021
CN 112740415 A 4/2021
(Continued)

OTHER PUBLICATIONS

Korean Office Action dated Jul. 24, 2025, issued in corresponding Korean Patent Application No. 10-2021-0111703 (7 pages).

*Primary Examiner* — Wael M Fahmy
*Assistant Examiner* — Tiberiu Dan Onuta
(74) *Attorney, Agent, or Firm* — Womble Bond Dickinson (US) LLP

(57) ABSTRACT

A display device includes: a circuit substrate including a plurality of pixel circuit units and a plurality of pads on a first surface thereof, the plurality of pads being electrically connected to the pixel circuit units; a display substrate on the circuit substrate and including a plurality of light emitting elements electrically connected to the pixel circuit units; a circuit board on the circuit substrate and including a plurality of circuit board pads electrically connected to the pads; a heat dissipation substrate on a second surface of the circuit substrate, the second surface being opposite to the first surface; and a cover substrate on the heat dissipation substrate and partially overlapping the circuit substrate and the circuit board. Each of the plurality of pads is in direct contact with at least one of the plurality of circuit board pads.

20 Claims, 28 Drawing Sheets

(51) Int. Cl.

| | |
|---|---|
| *H01L 23/40* | (2006.01) |
| *H01L 23/552* | (2006.01) |
| *H01L 25/065* | (2023.01) |
| *H05K 1/11* | (2006.01) |
| *H05K 1/18* | (2006.01) |
| *H05K 1/189* | (2026.01) |
| *H10H 29/14* | (2025.01) |

(52) U.S. Cl.
CPC .............. *H01L 24/05* (2013.01); *H01L 24/72* (2013.01); *H01L 25/0657* (2013.01); *H05K 1/118* (2013.01); *H05K 1/189* (2013.01); *H01L 2023/4081* (2013.01); *H01L 2023/4087* (2013.01); *H01L 24/14* (2013.01); *H01L 2224/05026* (2013.01); *H01L 2224/05073* (2013.01); *H01L 2224/05082* (2013.01); *H01L 2224/05111* (2013.01); *H01L 2224/05124* (2013.01); *H01L 2224/05144* (2013.01); *H01L 2224/05147* (2013.01); *H01L 2224/05564* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05666* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2224/1403* (2013.01); *H01L 2224/72* (2013.01); *H01L 2225/06513* (2013.01); *H01L 2225/06589* (2013.01); *H01L 2225/06593* (2013.01); *H01L 2924/0132* (2013.01); *H01L 2924/0133* (2013.01); *H05K 2201/09063* (2013.01); *H05K 2201/09409* (2013.01); *H05K 2201/10128* (2013.01); *H05K 2201/10393* (2013.01); *H10H 29/142* (2025.01)

(58) Field of Classification Search
CPC . H01L 2224/05124; H01L 2224/05144; H01L 2224/05147; H01L 2224/05564; H01L 2224/05573; H01L 2224/05611; H01L 2224/05624; H01L 2224/05639; H01L 2224/05644; H01L 2224/05647; H01L 2224/05666; H01L 2224/13111; H01L 2224/13124; H01L 2224/13139; H01L 2224/13144; H01L 2224/13147; H01L 2224/13166; H01L 2224/1403; H01L 2224/72; H01L 25/18; H01L 25/0657; H01L 25/167; H01L 24/05; H01L 24/72; H01L 24/14; H01L 24/45; H01L 24/48; H01L 2023/4081; H01L 2023/4087; H01L 23/4006; H01L 23/552; H01L 2225/06513; H01L 2225/06589; H01L 2225/06593; H01L 2924/0132; H01L 2924/0133; H05K 1/118; H05K 1/189; H05K 1/0201; H05K 2201/09063; H05K 2201/09409; H05K 2201/10128; H05K 2201/10393; H05K 7/20954; H10H 29/142; H10H 20/857; H10H 20/851; H10H 20/852; G02B 5/201

See application file for complete search history.

(56) References Cited

U.S. PATENT DOCUMENTS

| | | | |
|---|---|---|---|
| 2006/0023762 A1 | 2/2006 | Nishida et al. | |
| 2016/0013170 A1 | 1/2016 | Sakariya et al. | |
| 2017/0309698 A1 | 10/2017 | Bower et al. | |
| 2021/0288216 A1* | 9/2021 | Obata ................. | H10H 20/812 |
| 2021/0307153 A1* | 9/2021 | Mohammad ......... | H05K 7/1061 |

FOREIGN PATENT DOCUMENTS

| | | |
|---|---|---|
| KR | 10-2017-0080755 A | 7/2017 |
| KR | 10-2018-0133649 A | 12/2018 |
| KR | 10-2021-0028784 A | 3/2021 |
| KR | 10-2021-0102510 A | 8/2021 |

* cited by examiner

ED: SEM1, EBL, MQW, SL, SEM2

10_1

900  CB  700    300    700  900  CB
PDC
PD
100
500

DR3
DR1
DR2

DISPLAY DEVICE WITH A HEAT DISSIPATION SUBSTRATE AND A COVER SUBSTRATE

CROSS-REFERENCE TO RELATED APPLICATION

This application claims priority to and the benefit of Korean Patent Application No. 10-2021-0111703, filed on Aug. 24, 2021, in the Korean Intellectual Property Office, the contents of which are herein incorporated herein by reference in their entirety.

BACKGROUND

1. Field

Aspects of embodiments of the present disclosure relate to a display device.

2. Description of the Related Art

As the information society develops, the demand for display devices for displaying images is increasing in various forms. Display devices may be flat panel displays, such as liquid crystal displays, field emission displays, and light emitting displays. The light emitting displays may be an organic light emitting display including an organic light emitting diode element as a light emitting element or an inorganic light emitting display including an inorganic semiconductor element as a light emitting element.

Recently, a head-mounted display including a light emitting display has been developed. A head-mounted display is a virtual reality (VR) or augmented reality (AR) glasses-type monitor device that is worn by a user in the form of glasses or a helmet and forms a focus (e.g., a display focus or image focus) at a relatively short distance in front of the eyes.

SUMMARY

Embodiments of the present disclosure provide an ultra-high resolution display device including inorganic light emitting elements and having a relatively high (e.g., a greater) number of emission areas per unit area.

Embodiments of the present disclosure also provide a display device in which a pad bonding structure of a circuit board and a circuit substrate is relatively simple (e.g., is simplified).

The present disclosure, however, is not restricted to the aspects and features set forth above and herein. The above and other aspects and features of the present disclosure will become more apparent to one of ordinary skill in the art to which the present disclosure pertains by referencing the detailed description of the present disclosure given below.

According to an embodiment of the present disclosure, a display device includes: a circuit substrate including a plurality of pixel circuit units and a plurality of pads on a first surface thereof, the plurality of pads being electrically connected to the pixel circuit units; a display substrate on the circuit substrate and including a plurality of light emitting elements electrically connected to the pixel circuit units; a circuit board on the circuit substrate and including a plurality of circuit board pads electrically connected to the pads; a heat dissipation substrate on a second surface of the circuit substrate, the second surface being opposite to the first surface; and a cover substrate on the heat dissipation substrate and partially overlapping the circuit substrate and the circuit board. Each of the plurality of pads is in direct contact with at least one of the plurality of circuit board pads.

A portion of the cover substrate may be on the second surface of the circuit board on which the circuit board pads are formed, and a physical interface may exist between the pads and the circuit board pads.

The plurality of circuit board pads may respectively correspond to the plurality of pads, and the number of the circuit board pads may be the same as the number of the pads.

An area of the heat dissipation substrate may be larger than an area of the circuit substrate, and the cover substrate may have a first portion overlapping the pads and the circuit board pads and a second portion overlapping a portion of the heat dissipation substrate at where the circuit substrate is not disposed.

The display device may further include a plurality of clamping parts. The cover substrate may have a plurality of first holes in the second portion, and the heat dissipation substrate may have a plurality of second holes respectively corresponding to the plurality of first holes. The plurality of clamping parts may be inserted into corresponding ones of the first holes and the second holes.

The display device may further include an adhesive member between the second portion of the cover substrate and the heat dissipation substrate.

The circuit board may have an opening corresponding to the display substrate, and the display substrate may be in the opening in the circuit substrate.

The cover substrate may have an opening corresponding to the display substrate, and the display substrate may protrude from a top surface of the cover substrate.

The display device may further include a cushion layer between the cover substrate and the circuit board, the cushion layer may overlap the plurality of pads and the plurality of circuit board pads.

The cushion layer may include silicone, urethane, or acrylic rubber and a light blocking material.

The cover substrate may include a plastic material or metal.

The display device may further include a shielding layer between the cover substrate and the cushion layer, and the shielding layer may include a metal material.

Each of the plurality of light emitting elements may include a first semiconductor layer, an active layer on the first semiconductor layer, and a second semiconductor layer on the active layer, and the display substrate may further include a third semiconductor layer with the second semiconductor layers of the light emitting elements being on one surface of the third semiconductor layer.

The second semiconductor layers of the plurality of light emitting elements may be connected to each other through a base layer on the one surface of the third semiconductor layer, and the circuit substrate may include a plurality of pixel electrodes overlapping the light emitting elements and a common electrode overlapping the base layer of the second semiconductor layer.

According to an embodiment of the present disclosure, a display device includes: a circuit substrate having a display area and a non-display area around the display area, the circuit substrate including a plurality of pads in the non-display area; a display substrate on a first surface of the circuit substrate and including a plurality of light emitting elements in the display area; a circuit board on one surface of the circuit substrate and having an opening corresponding to the display substrate, the circuit board including a plurality of circuit board pads corresponding to the pads and in direct contact with the pads; a cushion layer on the circuit board and not overlapping the display substrate; a cover substrate on the cushion layer and not overlapping the display substrate, the cover substrate having a plurality of first holes in a region that does not overlap the circuit board; a heat dissipation substrate on a second surface of the circuit substrate, the second surface being opposite to the first surface, the heat dissipation substrate having a plurality of second holes corresponding to the plurality of first holes; and a plurality of clamping parts inserted into ones of the first holes and the second holes.

Each of the cover substrate and the heat dissipation substrate may have a larger area than the circuit substrate, and the cover substrate may have an opening corresponding to the display substrate and may have a portion overlapping the pads and the circuit board pads in a thickness direction.

The cushion layer may overlap the pads and the circuit board pads in a thickness direction.

The plurality of pads may be on both sides of the display area, in the non-display area, in one direction, and the circuit board pads may be on both sides of the opening in the circuit board in the one direction.

The plurality of circuit board pads may correspond to the plurality of pads, and the number of the circuit board pads may be the same as the number of the pads.

The display device may further include a shielding layer between the cover substrate and the cushion layer, and the shielding layer may be made of a metal material.

A display device according to one embodiment includes a cover substrate that causes a circuit board and a circuit substrate to be in contact with each other and is coupled to a heat dissipation substrate under the circuit board. In the display device, because pads of the circuit substrate are fixed to circuit board pads of the circuit board in a physical contact state, a repair process due to electrical connection failure between the pads, and a manufacturing process, are simplified.

However, aspects and features of the present disclosure are not limited to the aforementioned aspects and features, and various other aspects and features are included in the specification or would be understood by one of ordinary skill in the art.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
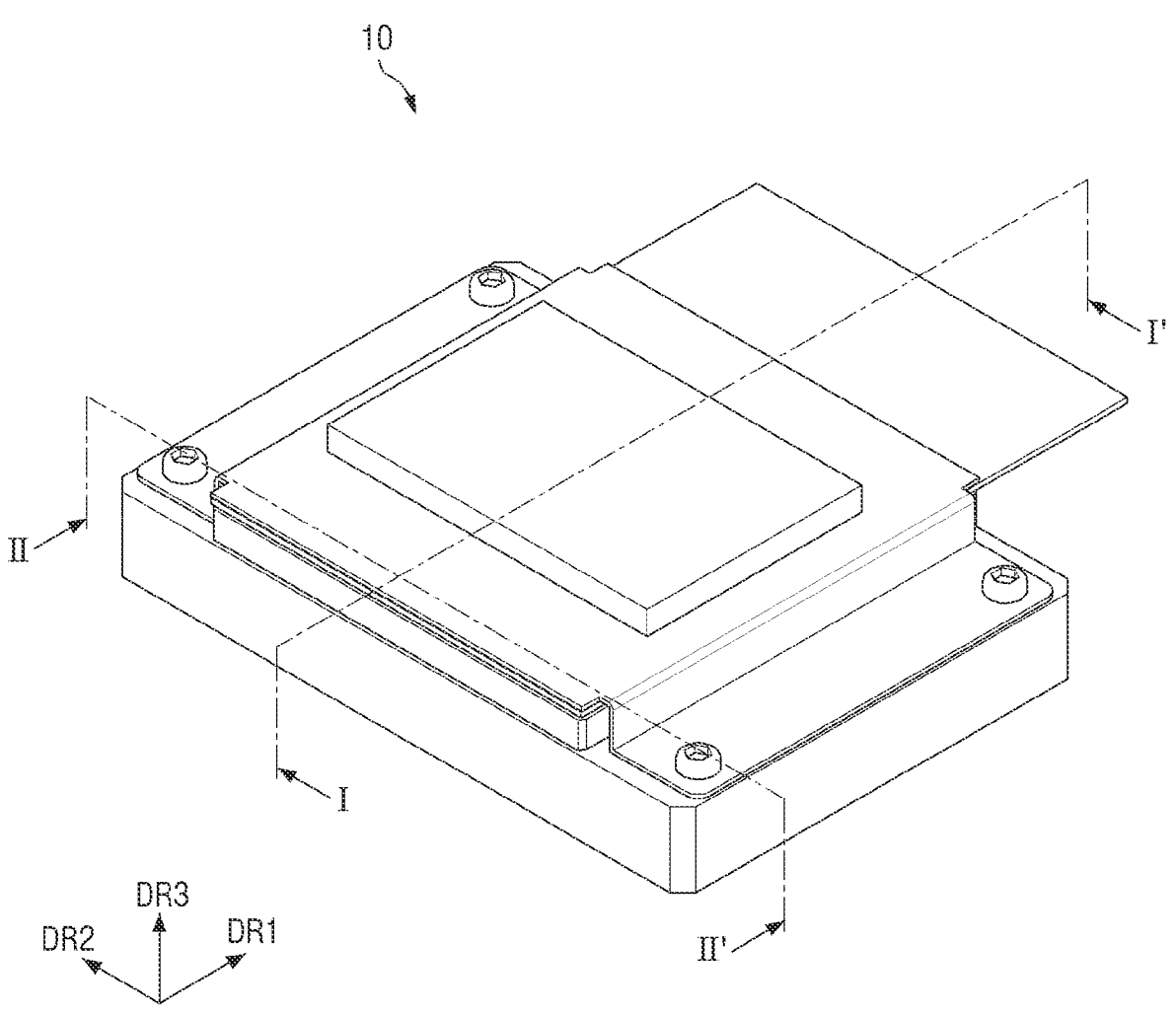
FIG. 1 is a perspective view of a display device according to one embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described with reference to the accompanying drawings.

FIG. 1 is a perspective view of a display device according to one embodiment.

Referring to FIG. 1, a display device 10 displays (e.g., is configured to display) a moving image and/or a still image. The display device 10 may refer to (e.g., may schematically represent) any electronic device providing (or including) a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like that provide a display screen.

The display device 10 includes a display panel that provides (or includes) a display screen. Examples of the display panel may include an inorganic light emitting diode display panel, an organic light emitting display panel, a quantum dot light emitting display panel, a plasma display panel, and a field emission display panel. In the following description, a display device in which inorganic light emitting diodes are disposed on a semiconductor circuit board is illustrated as an example of the display panel. However, the present disclosure is not limited thereto, and aspects and features of the present disclosure may be applied to other display panels as long as the same technical spirit is applicable.

The shape of the display device 10 may be variously modified. For example, the display device 10 may have a rectangular shape elongated in a horizontal direction, a rectangular shape elongated in a vertical direction, a square shape, a quadrilateral shape with rounded corners (e.g., vertices), another polygonal shape, and a circular shape. The shape of a display area DPA of the display device 10 (see, e.g., FIG. 7) may be similar to the overall shape of the display device 10. The embodiment of the display device 10 illustrated in FIG. 1 has a rectangular shape elongated in a second direction DR2.

Figure 2:
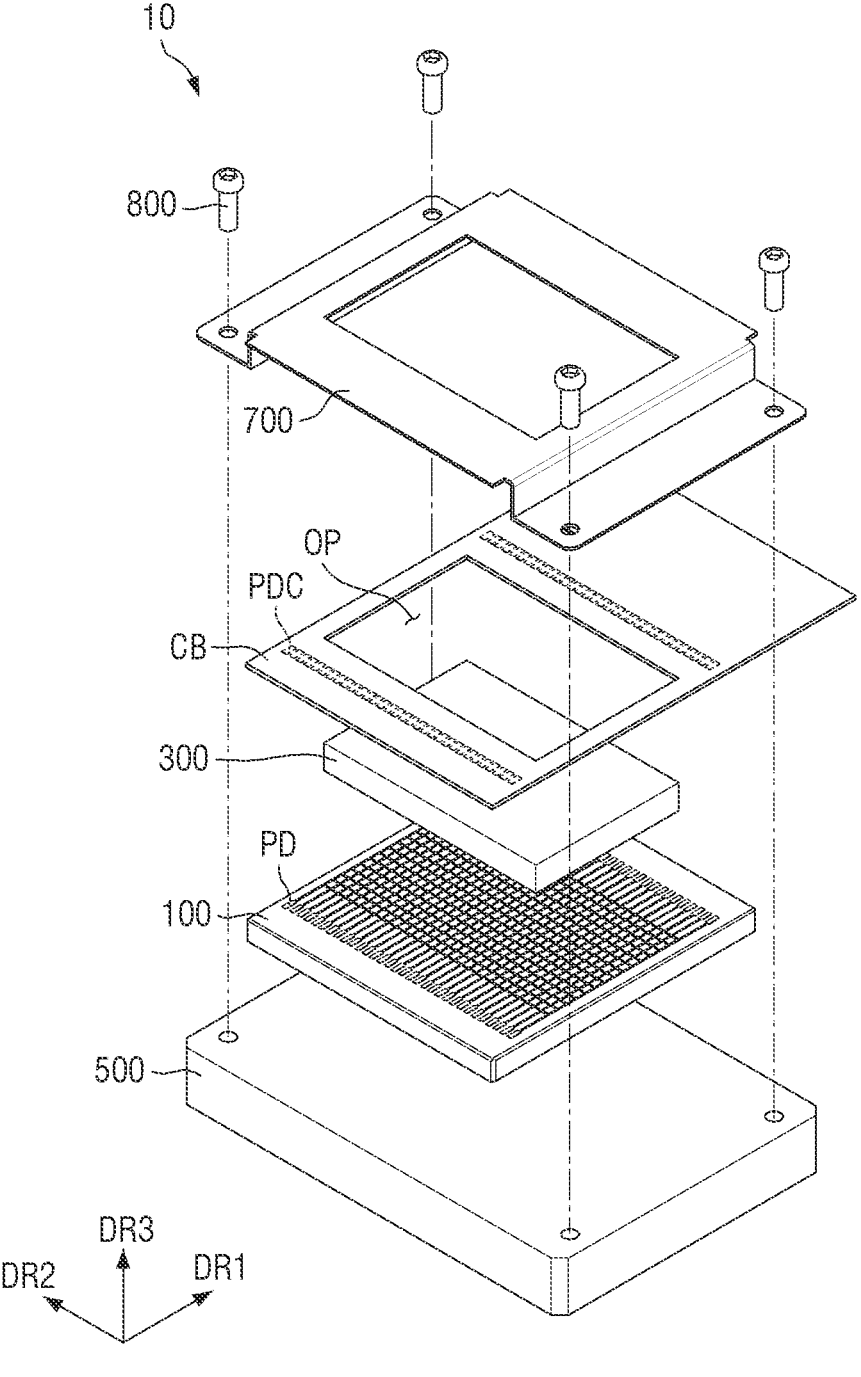
FIG. 2 is an exploded perspective view of the display device shown in FIG. 1.
Figure 3:
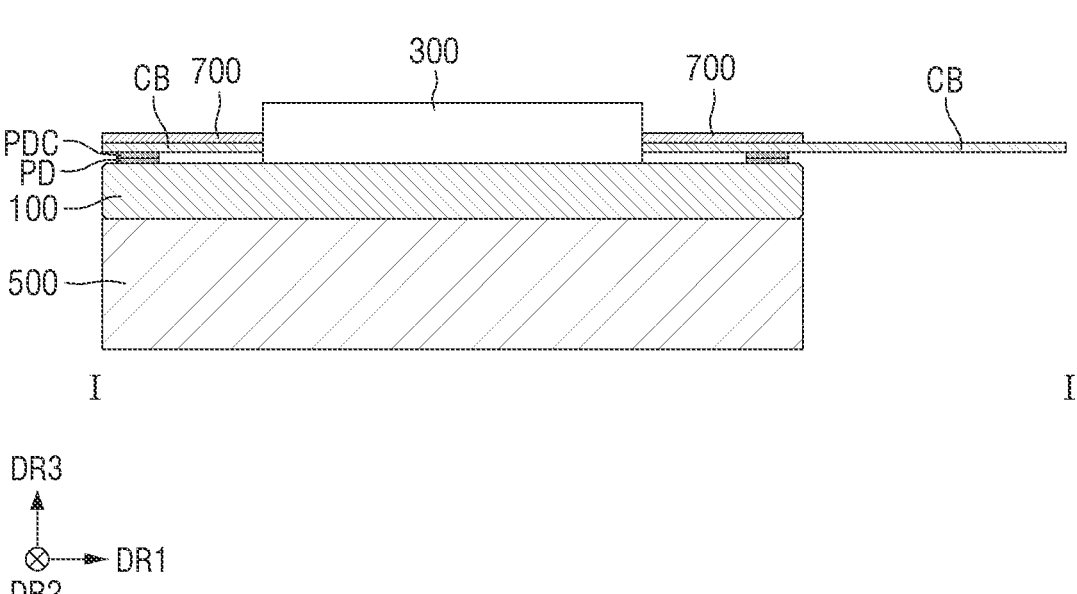
FIG. 3 is a cross-sectional view taken along the line I-I' of FIG. 1.
Figure 4:
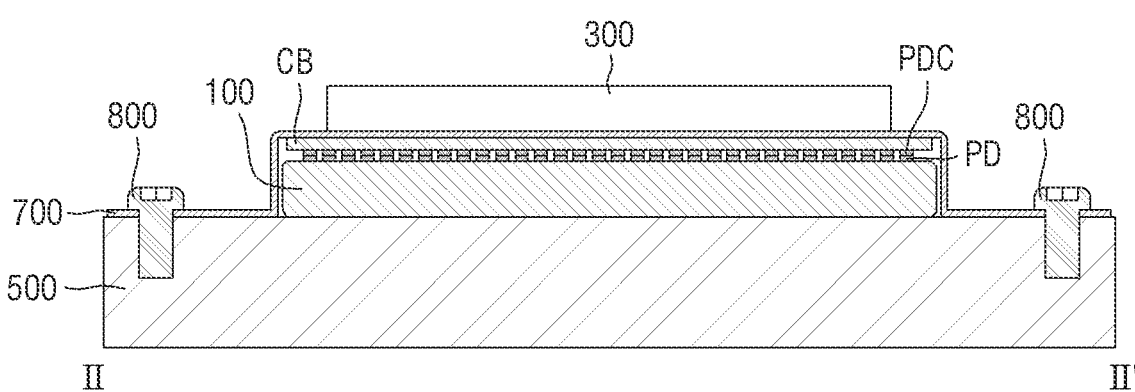
FIG. 4 is a cross-sectional view taken along the line II-II' of FIG. 1.
Figure 4:
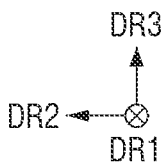

FIG. 2 is an exploded perspective view of the display device shown in FIG. 1, FIG. 3 is a cross-sectional view taken along the line I-I' of FIG. 1, and FIG. 4 is a cross-sectional view taken along the line II-II' of FIG. 1. FIG. 3 shows a cross section across the display device 10 shown in FIG. 1 in a first direction DR1, and FIG. 4 shows a cross section across a plurality of pads PD and circuit board pads PDC of the display device 10 shown in FIG. 1 in the second direction DR2.

Referring to FIGS. 2 to 4 in conjunction with FIG. 1, the display device 10 according to one embodiment may include a circuit substrate 100, a display substrate 300, a heat dissipation substrate 500, a circuit board CB, and a cover substrate 700. In the display device 10, the circuit substrate 100, the display substrate 300, and the circuit board CB may be disposed on the heat dissipation substrate 500, and the cover substrate 700 may cover a part of the circuit board CB and the circuit substrate 100. The cover substrate 700 may be coupled to the heat dissipation substrate 500 by a clamping part 800 and may fix (e.g., bond) the circuit substrate 100 and the circuit board CB, which are disposed therebetween, to each other.

The circuit substrate 100 may include a pixel circuit unit (see, e.g., PXC in FIG. 13) electrically connected to light emitting elements (see, e.g., ED in FIG. 13) included in the display substrate 300, and a plurality of pads PD electrically connected to wires of the pixel circuit units PXC. The pixel circuit units PXC may be disposed in the center of the circuit substrate 100, and the plurality of pads PD may be disposed on one side and the other side (e.g., the opposite side) of a region at where the pixel circuit units PXC are disposed in, for example, the first direction DR1. In one embodiment in which the circuit substrate 100 includes the plurality of pads PD, the plurality of pads PD, which are disposed on one side of the center portion of the circuit substrate 100 in the first direction DR1, may be disposed to be spaced apart from each other in the second direction DR2. The plurality of pads PD may be disposed on a top surface of the circuit substrate 100 and may be electrically connected to the circuit board pads PDC of the circuit board CB.

The display substrate 300 may be disposed on one surface of the circuit substrate 100. As will be described later, the display substrate 300 may have a display area (see, e.g., DPA in FIG. 7) and a non-display area (see, e.g., NDA in FIG. 7). The plurality of light emitting elements ED disposed in the display area DPA may emit light by receiving an electrical signal from the pixel circuit units PXC of the circuit substrate 100. A more detailed description of the circuit substrate 100 and the structure of the pixels PX included in the display substrate 300 will be described later with reference to other drawings.

The heat dissipation substrate 500 may be disposed on a bottom surface of the circuit substrate 100, which is the other surface opposite to the top surface thereof that faces the display substrate 300. The heat dissipation substrate 500 may contact the bottom surface of the circuit substrate 100 and may have a shape substantially similar to that of the circuit substrate 100 and a larger area (e.g., a larger surface area) than the circuit substrate 100. According to one embodiment, the heat dissipation substrate 500 may be disposed such that at least a part (or portion) thereof overlaps the display substrate 300 in a thickness direction (e.g., a third direction DR3 in FIGS. 1 and 2) and another part thereof overlaps a region of the circuit substrate 100 on which the display substrate 300 is not disposed. The heat dissipation substrate 500 may contain a material having high thermal conductivity and, thus, may effectively release (e.g., absorb and emit) the heat generated by the circuit substrate 100 and the circuit board CB. For example, the heat dissipation substrate 500 may be made of a metal material having high thermal conductivity, such as tungsten (W), aluminum (Al), and copper (Cu).

The circuit board CB may be disposed on the circuit substrate 100. The circuit board CB may have an opening OP formed to correspond to the display substrate 300, and the display substrate 300 may be disposed in the opening OP in the circuit board CB. The circuit board CB may be disposed on the region of the circuit substrate 100 where the display substrate 300 is not disposed without overlapping the display substrate 300 in the thickness direction. The opening OP in the circuit board CB may be larger than the display substrate 300. The circuit board CB may have the same width as the width of the circuit substrate 100 in the second direction DR2 but may have a longer length than the length of the circuit substrate 100 in the first direction DR1. The circuit board CB may be disposed to protrude from the circuit substrate 100 toward one side of the display device 10 in the first direction DR1.

The circuit board CB may be a flexible printed circuit board (FPCB), a printed circuit board (PCB), a flexible printed circuit (FPC), or a flexible film, such as a chip on film (COF).

The circuit board CB may include the plurality of circuit board pads PDC.

The circuit board pads PDC may be disposed on a bottom surface of a base substrate of the circuit board CB, which faces the circuit substrate 100, and may be in contact with the plurality of pads PD of the circuit substrate 100. The circuit board CB may include a driving unit electrically connected to the pixel circuit unit PXC of the circuit substrate 100. The driving unit may be electrically connected to the pixel circuit unit PXC via the circuit board pads PDC of the circuit substrate 100 and the pads PD of the circuit substrate 100.

The circuit board pads PDC of the circuit board CB may be disposed to correspond to the plurality of pads PD of the circuit substrate 100. According to one embodiment, the circuit substrate 100 may include the plurality of pads PD disposed on each of one side of the region where the pixel circuit units PXC are disposed in the first direction DR1 and the other side thereof in the first direction DR1. The plurality of circuit board pads PDC may be disposed to correspond to the plurality of pads PD of the circuit substrate 100, respectively. The plurality of circuit board pads PDC may be disposed on each of one side of the opening OP in the first direction DR1 and the other side thereof in the first direction DR1. In one embodiment in which the circuit board CB includes the plurality of circuit board pads PDC, the plurality of circuit board pads PDC, which are disposed on one side of the opening OP in the first direction DR1, may be disposed to be spaced apart from each other in the second direction DR2.

In one embodiment, the number of pads PD of the circuit substrate 100 may be equal to the number of circuit board pads PDC of the circuit board CB. For example, one pad PD may be disposed to correspond to one circuit board pad PDC, and the pads PD of the circuit substrate 100 may overlap the circuit board pads PDC of the circuit board CB in the third direction DR3. However, the present disclosure is not limited thereto. In some embodiments, one circuit board pad PDC may be formed to correspond to the plurality of pads PD. For example, one circuit board pad PDC may overlap two or more pads PD in the third direction DR3 and may be electrically connected thereto.

According to one embodiment, the pads PD of the circuit substrate 100 may be in direct contact with the circuit board pads PDC of the circuit board CB. The pads PD of the circuit substrate 100 and the circuit board pads PDC of the circuit board CB may be in physical contact with each other to be electrically connected to each other. Each of the pad PD and the circuit board pad PDC may be made of a conductive material, and they may be in physical contact with each other without a member for coupling or bonding them, thereby forming an electrical connection therebetween. The display device 10 also includes the cover substrate 700 disposed on the circuit board CB, and the cover substrate 700 and the heat dissipation substrate 500 are coupled to each other so that the circuit substrate 100 and the circuit board CB may be fixed.

Because the pads PD of the circuit substrate 100 and the circuit board pads PDC of the circuit board CB are fixed to each other in a physical contact state, a repair process due to electrical connection failure between the pads PD and PDC and the manufacturing process of the display device 10 may be simplified.

Figure 5:
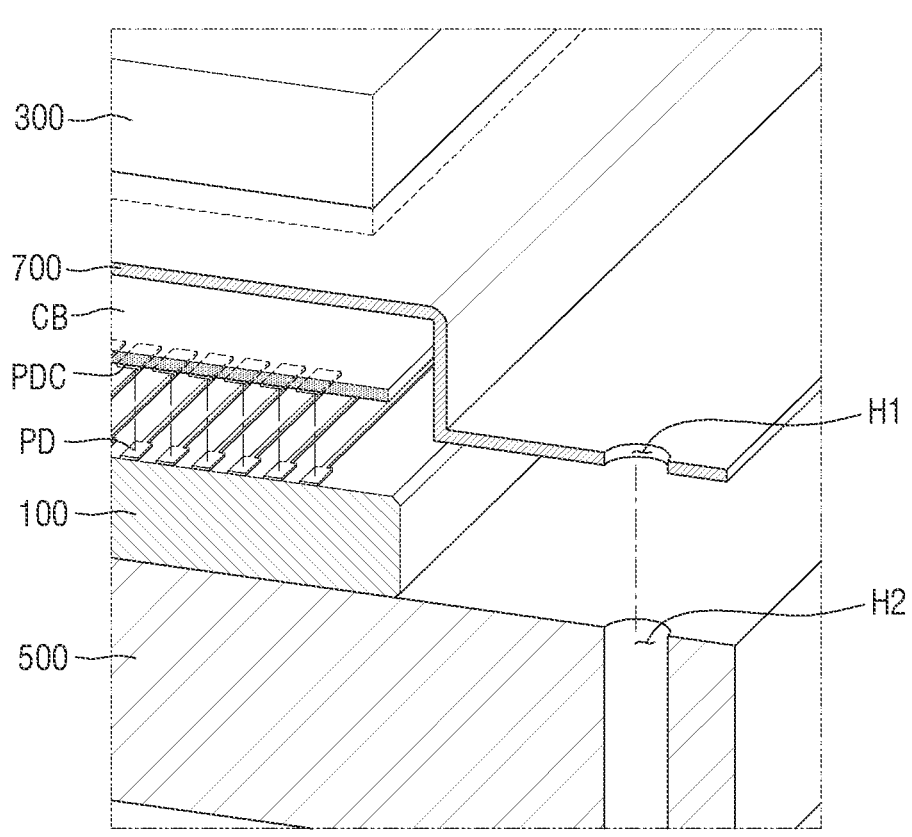
FIG. 5 is a partial enlarged view of the display device shown in FIG. 1 in an exploded view.
Figure 5:
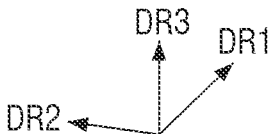
Figure 6:
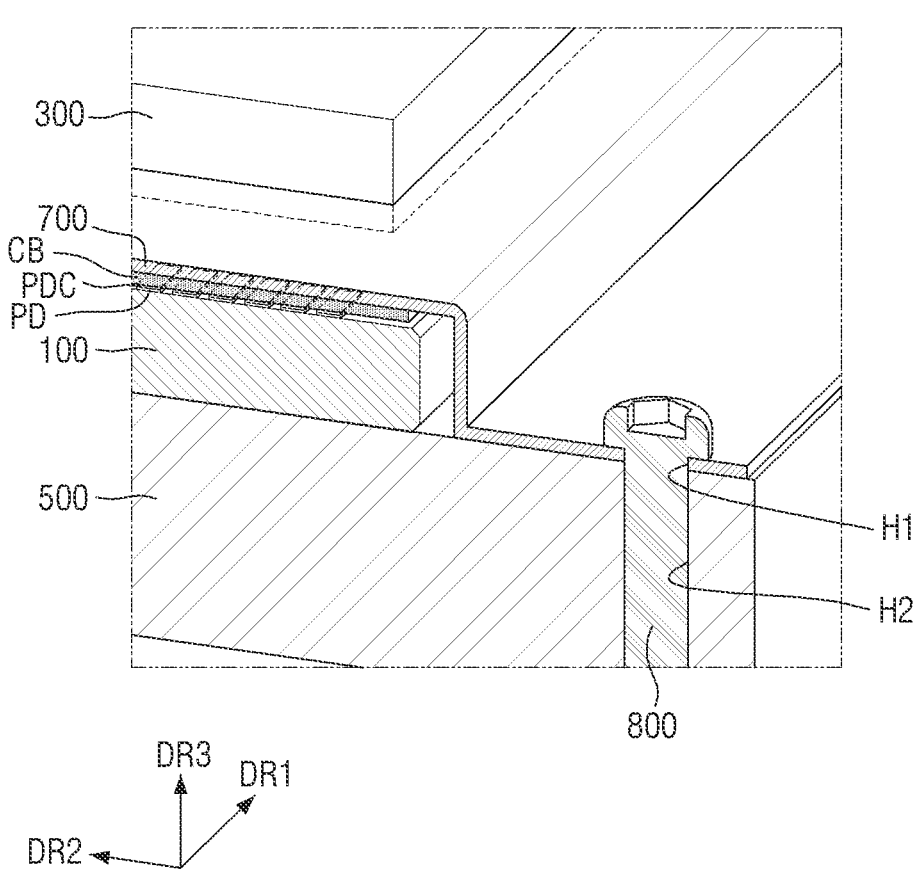
FIG. 6 is a partial enlarged view of the display device shown in FIG. 1.

FIG. 5 is an enlarged view of a portion of the display device shown in FIG. 1 in an exploded state, and FIG. 6 is an enlarged view of the same portion of display device shown in FIG. 1 in a non-exploded state. FIG. 5 illustrates a state in which the heat dissipation substrate 500, the cover substrate 700, the circuit board CB, and the circuit substrate 100 are spaced apart from each other at the corner portion of the display device 10, and FIG. 6 illustrates a state in which the circuit board CB and the circuit substrate 100 are in contact with each other due to the coupling of the heat dissipation substrate 500 and the cover substrate 700 to each other.

Referring to FIGS. 5 and 6 in conjunction with FIGS. 2 to 4, the display device 10 according to one embodiment may include the cover substrate 700 disposed on the circuit board CB and the plurality of clamping parts 800 for coupling the cover substrate 700 and the heat dissipation substrate 500 to each other. The cover substrate 700 may be disposed to cover the top surface of the heat dissipation substrate 500 except (e.g., other than) the display substrate 300. Accordingly, the display substrate 300 may be disposed to protrude from (e.g., to protrude above) the top surface of the cover substrate 700.

The cover substrate 700 may have substantially the same area as the heat dissipation substrate 500 in a plan view but may have an opening corresponding to the display substrate 300, similar to the circuit board CB. The cover substrate 700 may partially overlap the heat dissipation substrate 500, the circuit substrate 100, and the circuit board CB without overlapping the display substrate 300. Because the cover substrate 700 has the opening formed at where the display substrate 300 is disposed, it may not overlap the portions of the heat dissipation substrate 500 and the circuit substrate 100 on which the display substrate 300 is disposed. The cover substrate 700 may be disposed to overlap the circuit board CB and the heat dissipation substrate 500 in a region where the pads PD of the circuit substrate 100 are arranged and may overlap only the heat dissipation substrate 500 outside the circuit substrate 100.

The cover substrate 700 may have a first portion covering the circuit substrate 100 and having the opening and a second portion connected to the first portion in the second direction DR2 and in an opposite direction thereto. The second portion of the cover substrate 700 may be bent from the first portion in a downward direction that is an opposite direction to the third direction DR3. Because the circuit substrate 100 has a smaller area than the heat dissipation substrate 500, the top surface of the heat dissipation substrate 500 may be partially exposed without the circuit substrate 100 disposed thereon. The cover substrate 700 having the second portion including a bent part according to a step due to the circuit substrate 100. The first portion may cover the circuit substrate 100, and the second portion may cover the exposed part of the heat dissipation substrate 500.

According to one embodiment, the cover substrate 700 may have a first hole (or first opening) H1 formed in the second portion, and the heat dissipation substrate 500 may have a second hole (or second opening) H2 formed to correspond to the first hole H1. The first hole H1 may be formed to penetrate the cover substrate 700. The second hole H2 may be formed in the top surface of the heat dissipation substrate 500 without penetrating the heat dissipation substrate 500. However, the present disclosure is not limited thereto, and the second hole H2 may penetrate the heat dissipation substrate 500.

The display device 10 may include a plurality of first holes H1 and a plurality of the second holes H2, and the first holes H1 and the second holes H2 may be formed to correspond (e.g., to correspond in number and location) to each other. In one embodiment in which the display device 10 has a substantially rectangular shape with sides extending in the first direction DR1 and the second direction DR2, the cover substrate 700 may have four first holes H1 and the heat dissipation substrate 500 may have four second holes H2. The first holes H1 and the second holes H2 may be respectively disposed on both sides of the display device 10 that extend in the first direction DR1. However, the present disclosure is not limited thereto, and the display device 10 may have four or more, or fewer, first holes H1 and second holes H2 corresponding to the shapes thereof. The cover substrate 700 may be disposed on the circuit board CB such that the plurality of first holes H1 are aligned with the second holes H2 in the heat dissipation substrate 500, respectively, and may be coupled to the heat dissipation substrate 500 by the clamping parts 800 that are inserted into the respective holes H1 and H2.

The plurality of clamping parts 800 may be disposed to pass through the first holes H1 to be inserted into the second holes H2. The clamping parts 800 may fix (e.g., may completely fix) the cover substrate 700 to the heat dissipation substrate 500. In an embodiment, the plurality of clamping parts 800 may mechanically couple the cover substrate 700 and the heat dissipation substrate 500 to each other and may be a fastening member, such as a rivet or a bolt.

The circuit substrate 100 and the circuit board CB disposed between the cover substrate 700 and the heat dissipation substrate 500 may also be fixed (e.g., completely fixed) by them. The circuit board CB may be aligned such that the plurality of circuit board pads PDC correspond to the pads PD of the circuit substrate 100. The cover substrate 700 may be coupled to the heat dissipation substrate 500 to fix the circuit board CB on the circuit substrate 100. The first portion of the cover substrate 700 may be partially disposed on the other surface of the circuit board CB, which is opposite to one surface of the circuit board CB at where the circuit board pad PDC is formed. The cover substrate 700 may be disposed such that the first portion overlaps the region where the circuit board pads PDC and the pads PDs are disposed and may apply a force to fix the circuit board pads PDC and the pads PD to each other in a contact state.

The circuit board pads PDC of the circuit board CB may be fixed to the pads PD of the circuit substrate 100 in a physical contact state, and the circuit board pads PDC and the pads PD may be electrically connected to each other. In an embodiment, the cover substrate 700 may be made of a material that protects the circuit substrate 100 and the circuit board CB as the outer surface of the display device 10 and provides a fastening force to fix them together. For example, the cover substrate 700 may be made of a metal material or plastic having hardness (e.g., a hard plastic).

In the display device 10 according to one embodiment, the pad PD and the circuit board pad PDC, which are made of a conductive material, may be in contact with each other while forming a physical interface therebetween without being bonded to each other via another material or being fused to each other due to melting of the conductive material. In other words, in some embodiments, the display device 10 may not have other members disposed between the pads PD and the circuit board pads PDC or a trace of fusion thereof. In the display device 10, the pads PD and PDC of the circuit substrate 100 and the circuit board CB are in contact with each other to be electrically connected to each other due to mechanical coupling between the cover substrate 700 and the heat dissipation substrate 500. Accordingly, the physical interface exists between the pad PD and the circuit board pad PDC and a step of bonding them is omitted, thereby simplifying the manufacturing process of the display device 10. Further, if the cover substrate 700 is separated from the heat dissipation substrate 500 by removing the clamping part 800, the circuit substrate 100 and the circuit board CB are also separated from each other. Thus, the process of repairing or reassembling the pads PD and PDC is simplified when electrical connection failure occurs therebetween.

Hereinafter, the circuit substrate 100 and the display substrate 300 of the display device 10 will be described in detail with reference to other drawings.

Figure 7:
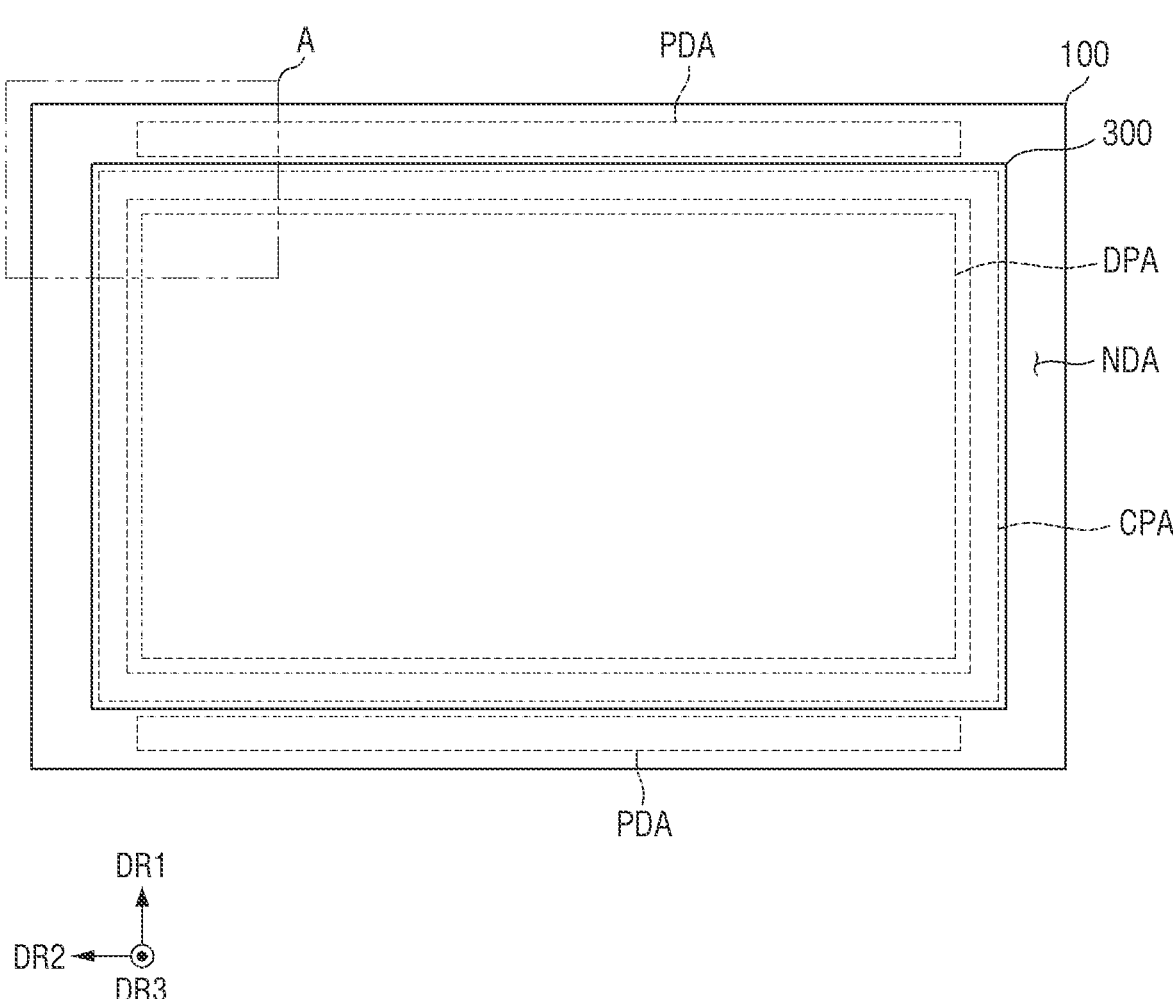
FIG. 7 is a plan view illustrating a circuit substrate and a display substrate of a display device according to one embodiment.

FIG. 7 is a plan view illustrating a circuit substrate and a display substrate of a display device according to one embodiment. FIG. 7 is a partial plan view of the circuit substrate 100 and schematically illustrates a portion where the display substrate 300 is disposed on the circuit substrate 100.

Referring to FIG. 7, the circuit substrate 100 and the display substrate 300 of the display device 10 may have the display area DPA and the non-display area NDA. The display area DPA is an area where a screen is provided (e.g., where an image can be displayed), and the non-display area NDA is an area where an image is not displayed. The display area DPA may also be referred to as an active region, and the non-display area NDA may also be referred to as a non-active region. The display area DPA may substantially occupy the center of the display substrate 300. The display area DPA may be defined in common in the circuit substrate 100 and the display substrate 300, and the non-display area NDA may be defined as an area surrounding (e.g., extending around a periphery of or surrounding in a plan view) the display area DPA in each of the circuit substrate 100 and the display substrate 300.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. The non-display area NDA may be partially covered by the circuit board CB and the cover substrate 700.

Wires or circuit drivers included in the display device 10 may be disposed in the non-display area NDA, or external devices may be mounted thereon. For example, the non-display area NDA may have a plurality of pad areas PDA and a common electrode connection portion CPA. The common electrode connection portion CPA may be disposed to surround the display area DPA, and the plurality of pad areas PDA may be disposed in a shape extending in one direction (e.g., a second direction DR2 in FIG. 7) on one side of the common electrode connection portion CPA. A plurality of pads PD (see, e.g., FIG. 8) electrically connected to an external device are disposed in the pad area PDA, and a common electrode CE electrically connected to a plurality of light emitting elements ED disposed in the display area DPA is disposed at the common electrode connection portion CPA. In the embodiment shown in FIG. 7, the pad area PDA is disposed on both sides of the display area DPA in a first direction DR1 and is disposed at the outer side of the common electrode connection portion CPA in the non-display area NDA. However, the present disclosure is not limited thereto, and a greater or a smaller number of pad areas PDA may be disposed. In some embodiments, the circuit substrate 100 may also have a pad area PDA disposed in an inner non-display area located at the inside of the common electrode connection portion CPA in the non-display area NDA.

Figure 8:
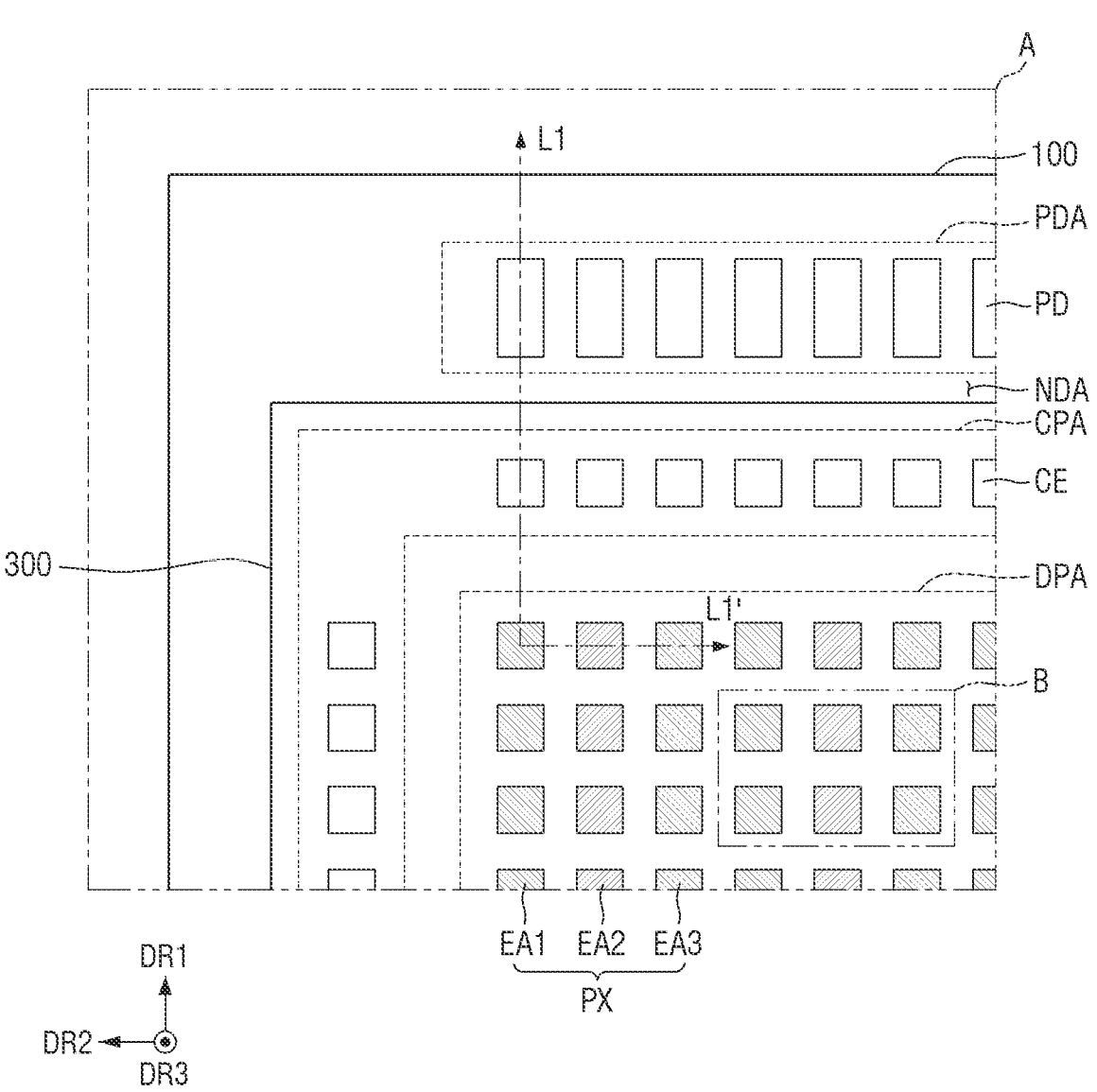
FIG. 8 is a plan view of the part A of FIG. 7.
Figure 9:
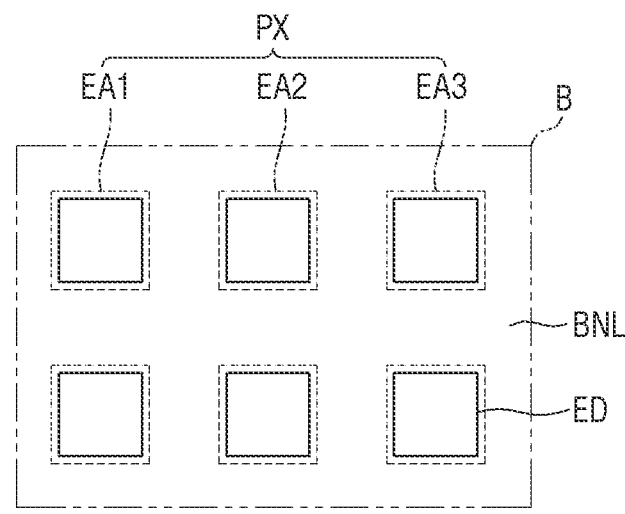
FIG. 9 is a plan view of the part B of FIG. 8.
Figure 9:
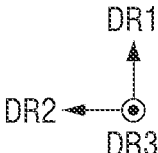

FIG. 8 is a plan view of the part A of FIG. 7, and FIG. 9 is a plan view of the part B of FIG. 8. FIG. 8 is a partial enlarged view of the display area DPA, the pad area PDA, and the common electrode connection portion CPA included in the circuit substrate 100 and the display substrate 300 of the display device 10. FIG. 9 illustrates a plan arrangement of some pixels PX of the display area DPA.

Referring to FIGS. 8 and 9, the display substrate 300 of the display device 10 may include a plurality of pixels PX. The plurality of pixels PX may be arranged in a matrix. The shape of each pixel PX may be a rectangular or square shape in a plan view. However, the present disclosure is not limited thereto, and the pixels PX may have a rhombic shape in which each side is inclined with respect to one direction. The pixels PX may be arranged in a stripe type or an island type. In addition, each of the pixels PX may include one or more light emitting elements that emit light of a specific wavelength band to display a specific color.

Each of the plurality of pixels PX may include a plurality of emission areas EA1, EA2, and EA3. In the display device 10, one pixel PX including the plurality of emission areas EA1, EA2, and EA3 may be a minimum light emitting unit.

For example, one pixel PX may include a first emission area EA1, a second emission area EA2, and a third emission area EA3. The first emission area EA1 may emit light of a first color, the second emission area EA2 may emit light of a second color, and the third emission area EA3 may emit light of a third color. For example, the first color may be red, the second color may be green, and the third color may be blue. However, the present disclosure is not limited thereto, and the emission areas EA1, EA2, and EA3 may emit light of the same color. In one embodiment, one pixel PX may include three emission areas EA1, EA2, and EA3, but the present disclosure is not limited thereto. For example, one pixel PX may include four or more emission areas.

Each of the plurality of emission areas EA1, EA2, and EA3 may include a light emitting element ED that emits light of a specific color. Although a light emitting element ED having a quadrilateral planar shape is illustrated, the present disclosure is not limited thereto. For example, the light emitting element ED may have a polygonal shape other than a quadrilateral shape, a circular shape, an elliptical shape, or an atypical shape.

The plurality of emission areas EA1, EA2, and EA3 may be arranged in the first direction DR1 and the second direction DR2, and the first emission area EA1, the second emission area EA2, and the third emission area EA3 may be alternately arranged in the second direction DR2. Because the plurality of pixels PX are arranged in the first direction DR1 and the second direction DR2, the first emission area EA1, the second emission area EA2, and the third emission area EA3 may be sequentially disposed in the first direction DR1 and such arrangement may be repeated. Further, the first emission area EA1, the second emission area EA2, and the third emission area EA3 may be repeatedly arranged in the first direction DR1.

The display device 10 may include a bank layer BNL surrounding the plurality of emission areas EA1, EA2, and EA3, and the bank layer BNL may distinguish different emission areas EA1, EA2, and EA3. The bank layer BNL may be disposed to surround the light emitting element ED while being spaced apart from the light emitting element ED in a plan view. The bank layer BNL may have portions extending in the first direction DR1 and the second direction DR2 to form a mesh, net, or lattice-shaped pattern in a plan view.

Although each of the emission areas EA1, EA2, and EA3 surrounded by the bank layer BNL has a quadrilateral shape in a plan view in the embodiment illustrated in FIGS. 8 and 9 is, the present disclosure is not limited thereto. The planar shape of each of the emission areas EA1, EA2, and EA3 may be variously modified depending on the planar arrangement of the bank layer BNL.

A plurality of common electrodes CE may be disposed at the common electrode connection portion CPA of the non-display area NDA. The plurality of common electrodes CE may be spaced apart from each other while surrounding the display area DPA. The common electrode CE may be electrically connected to the plurality of light emitting elements ED disposed in the display area DPA. Further, the common electrode CE may be electrically connected to the semiconductor circuit board (e.g., the circuit board CB).

Although the common electrode connection portion CPA is disposed to surround both sides in the first direction DR1 and the second direction DR2 of the display area DPA in the illustrated embodiment, the present disclosure is not limited thereto. The planar arrangement of the common electrode connection portion CPA may vary depending on the arrangement of the common electrodes CE. For example, when the common electrodes CE are arranged in one direction on one side of the display area DPA, the planar arrangement of the common electrode connection portion CPA may have a shape extending in one direction.

The plurality of pads PD may be disposed in the pad area PDA. Each of the pads PD may be electrically connected to the circuit board pad PDC disposed on the circuit board CB (e.g., the external circuit board). The plurality of pads PD may be spaced apart from each other in the second direction DR2 in the pad area PDA.

The arrangement of the pads PD may be designed depending on the number of light emitting elements ED disposed in the display area DPA and the arrangement of wires electrically connected thereto. The arrangement of the pads PD may be variously modified depending on the arrangement of the light emitting elements ED and the arrangement of the wires electrically connected thereto.

Figure 10:
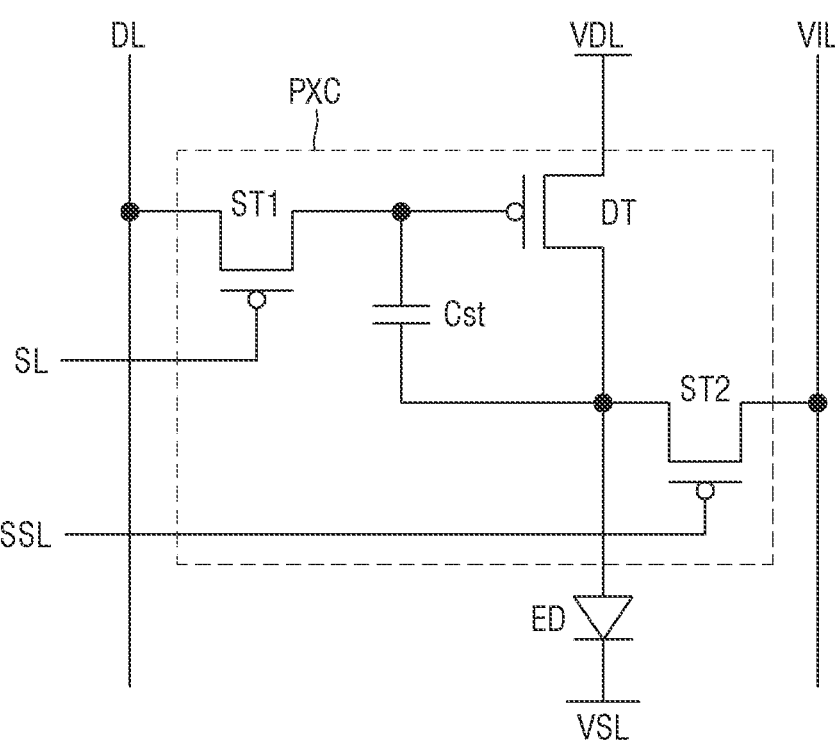
FIG. 10 is a circuit diagram of a pixel circuit unit and a light emitting element according to one embodiment.

FIG. 10 is a circuit diagram of a pixel circuit unit and a light emitting element according to one embodiment. FIG. 10 illustrates an example of the pixel circuit unit PXC and the light emitting element ED included in one pixel PX shown in FIG. 8.

Referring to FIG. 10, the light emitting element ED emits light according to a driving current Ids. A light emission amount of the light emitting element ED may be proportional to the driving current Ids. The light emitting element ED may include (or may be) an anode electrode, a cathode electrode, and an inorganic light emitting element including an inorganic semiconductor disposed between the anode electrode and the cathode electrode.

The anode electrode of the light emitting element ED may be connected to a source electrode of a driving transistor DT, and the cathode electrode thereof may be connected to a second power line VSL to which a low potential voltage lower than a high potential voltage is supplied.

The driving transistor DT adjusts a current flowing from a first power line VDL, to which a first source voltage is applied, to the light emitting element ED according to a voltage difference between a gate electrode and the source electrode. The gate electrode of the driving transistor DT may be connected to a first electrode of the first transistor ST1, the source electrode thereof may be connected to the anode electrode of the light emitting element ED, and a drain electrode thereof may be connected to the first power line VDL to which the high potential voltage is applied.

The first transistor ST1 is turned on by a scan signal applied from a scan line SL to connect a data line DL to the gate electrode of the driving transistor DTR. A gate electrode of the first transistor ST1 may be connected to the scan line SL, the first electrode thereof may be connected to the gate electrode of the driving transistor DT, and a second electrode thereof may be connected to the data line DL.

The second transistor ST2 is turned on by a sensing signal applied from a sensing signal line SSL to connect an initialization voltage line VIL to the source electrode of the driving transistor DT. A gate electrode of the second transistor ST2 may be connected to the sensing signal line SSL, a first electrode thereof may be connected to the initialization voltage line VIL, and a second electrode thereof may be connected to the source electrode of the driving transistor DT.

The first electrode of each of the first and second transistors ST1 and ST2 may be a source electrode, and the second electrode thereof may be a drain electrode, but they are not limited thereto. For example, the first electrode of each of the first and second transistors ST1 and ST2 may be a drain electrode, and the second electrodes thereof may be a source electrode.

A capacitor Cst is formed between the gate electrode and the source electrode of the driving transistor DT. The capacitor Cst stores a difference voltage between a gate voltage and a source voltage of the driving transistor DT.

In FIG. 10, the driving transistor DT and the first and second transistors ST1 and ST2 are described as being formed of an N-type metal oxide semiconductor field effect transistor (MOSFET), but they are not limited thereto. The driving transistor DT and the first and second transistors ST1 and ST2 may be formed of a P-type MOSFET.

Figure 11:
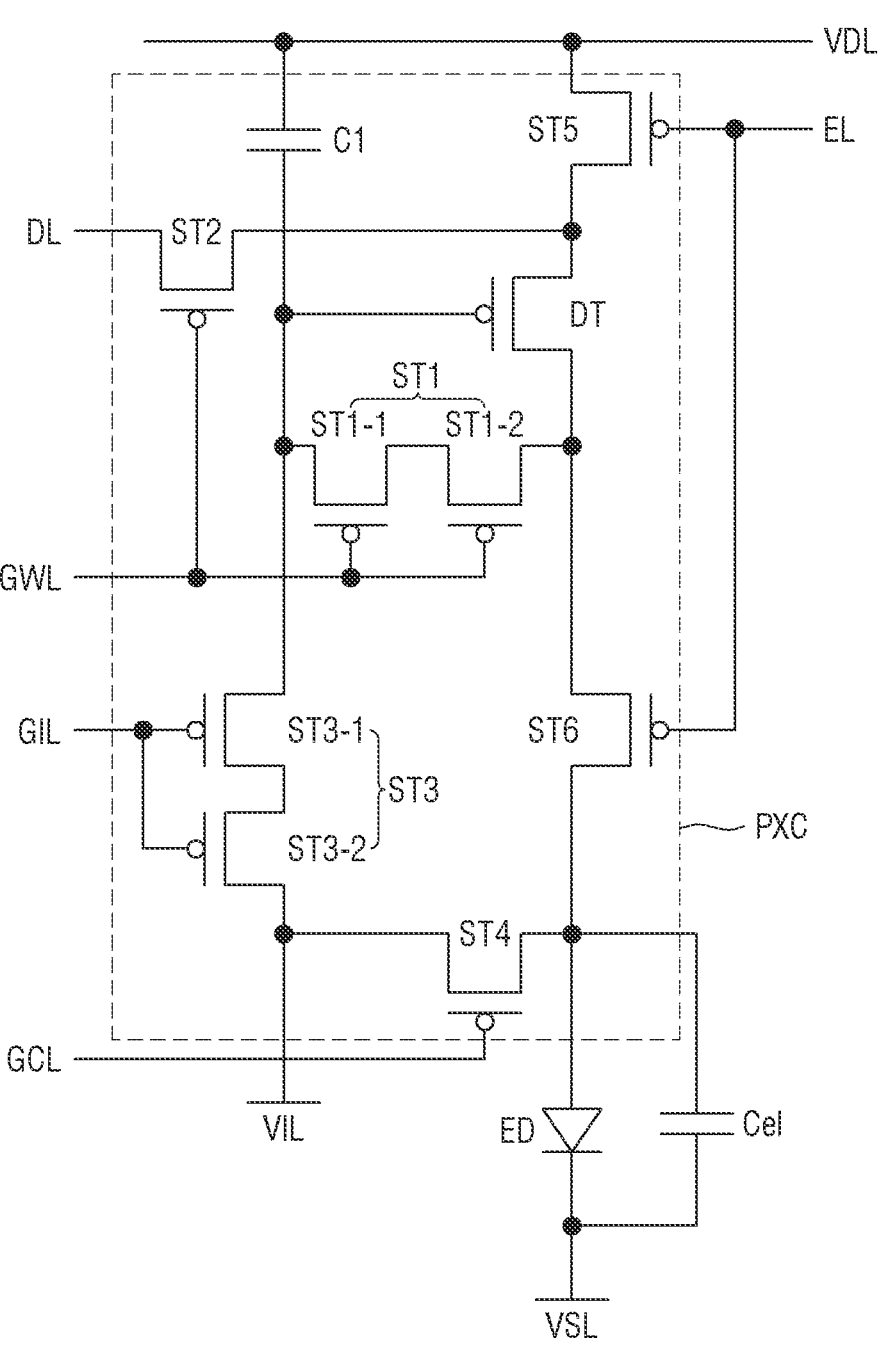
FIGS. 11 and 12 are circuit diagrams of a pixel circuit unit and a light emitting element according to other embodiments.
Figure 12:
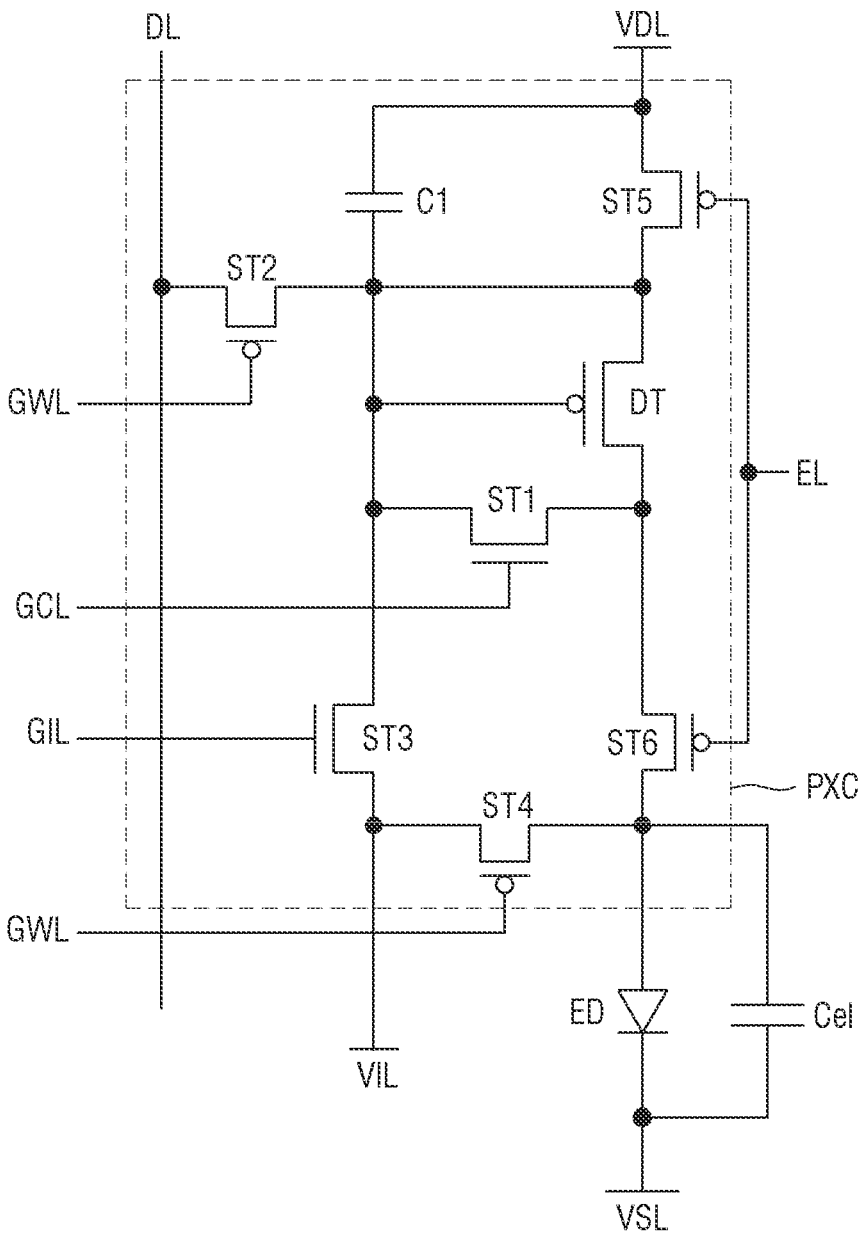

FIGS. 11 and 12 are circuit diagrams of a pixel circuit unit and a light emitting element according to other embodiments. FIGS. 11 and 12 illustrate other examples of the pixel circuit unit PXC and the light emitting element ED. The embodiment shown in FIG. 12 differs from the embodiment shown in FIG. 11 in that the driving transistor DT, the second transistor ST2, a fourth transistor ST4, a fifth transistor ST5, and a sixth transistor ST6 are formed of a P-type MOSFET while the first transistor ST1 and a third transistor ST3 are formed of an N-type MOSFET.

Referring to FIG. 11, the anode electrode of the light emitting element ED may be connected to a first electrode of the fourth transistor ST4 and a second electrode of the sixth transistor ST6, and the cathode electrode thereof may be connected to the second power line VSL. A parasitic capacitance Cel may be formed between the anode electrode and the cathode electrode of the light emitting element ED.

The pixel circuit unit PXC includes the driving transistor DT, the switch elements, and a capacitor C1. The switch elements include the first to sixth transistors ST1, ST2, ST3, ST4, ST5, and ST6. The first transistor ST1 may include transistors ST1-1 and ST1-2, and the third transistor may include transistors ST3-1 and ST3-2.

The driving transistor DT includes a gate electrode, a first electrode, and a second electrode. The driving transistor DT controls the driving current Ids, which is a drain-source current flowing between the first electrode and the second electrode thereof, according to a data voltage applied to the gate electrode.

The capacitor C1 is formed between the second electrode of the driving transistor DT and the first power line VDL. One electrode of the capacitor C1 may be connected to the second electrode of the driving transistor DT, and the other electrode thereof may be connected to the first power line VDL.

When the first electrode of each of the driving transistor DT and the first to sixth transistors ST1 to ST6 is a source electrode, the second electrode thereof may be a drain electrode. Alternatively, when the first electrode of each of the driving transistor DT and the first to sixth transistors ST1 to ST6 is a drain electrode, the second electrode thereof may be a source electrode.

An active layer of each of the driving transistor DT and the first to sixth transistors ST1 to ST6 may be formed of any one of polysilicon, amorphous silicon, or an oxide semiconductor. When a semiconductor layer of each of the driving transistor DT and the first to sixth transistors ST1 to ST6 is formed of polysilicon, a process for forming the semiconductor layer may be a low temperature polysilicon (LTPS) process.

Further, in FIG. 11, the driving transistor DT and the first to sixth transistors ST1 to ST6 are described as being formed of a p-type MOSFET, but without being limited thereto, they may be formed of an n-type MOSFET.

Furthermore, a first power voltage of the first power line VDL, a second power voltage of the second power line VSL, and a third power voltage of a third power line VIL may be set in consideration of the characteristics of the driving transistor DT, the characteristics of the light emitting element ED, and the like.

Referring to FIG. 12, an active layer of each of the driving transistor DT, the second transistor ST2, the fourth transistor ST4, the fifth transistor STS, and the sixth transistor ST6, which are configured as the P-type MOSFETs, may be formed of polysilicon, and an active layer of each of the first transistor ST1 and the third transistor ST3, which are configured as the N-type MOSFETs, may be formed of an oxide semiconductor.

The embodiment shown in FIG. 12 differs from the embodiment shown in FIG. 11 in that the gate electrode of the second transistor ST2 and a gate electrode of the fourth transistor ST4 are connected to a write scan line GWL, and the gate electrode of the first transistor ST1 is connected to a control scan line GCL. Further, in FIG. 12, because the first transistor ST1 and the third transistor ST3 are formed of the N-type MOSFET, the scan signal of a gate high voltage may be applied to the control scan line GCL and an initialization scan line GIL. In contrast, because the second transistor ST2, the fourth transistor ST4, the fifth transistor ST5, and the sixth transistor ST6 are formed of the P-type MOSFET, the scan signal of a gate low voltage may be applied to the write scan line GWL and a light emitting line EL.

Figure 13:
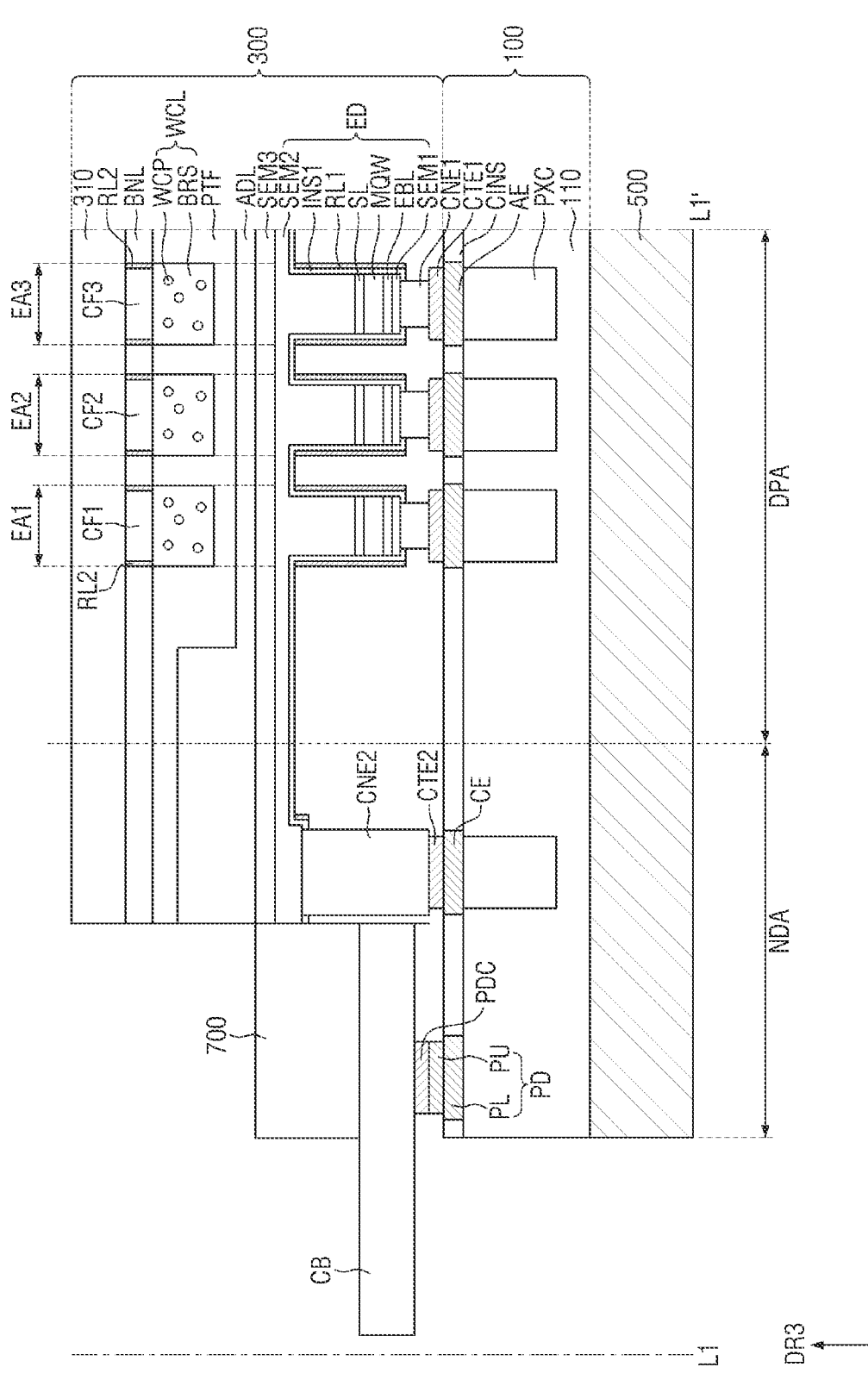
FIG. 13 is a cross-sectional view taken along the line L1-L1' of FIG. 8.
Figure 14:
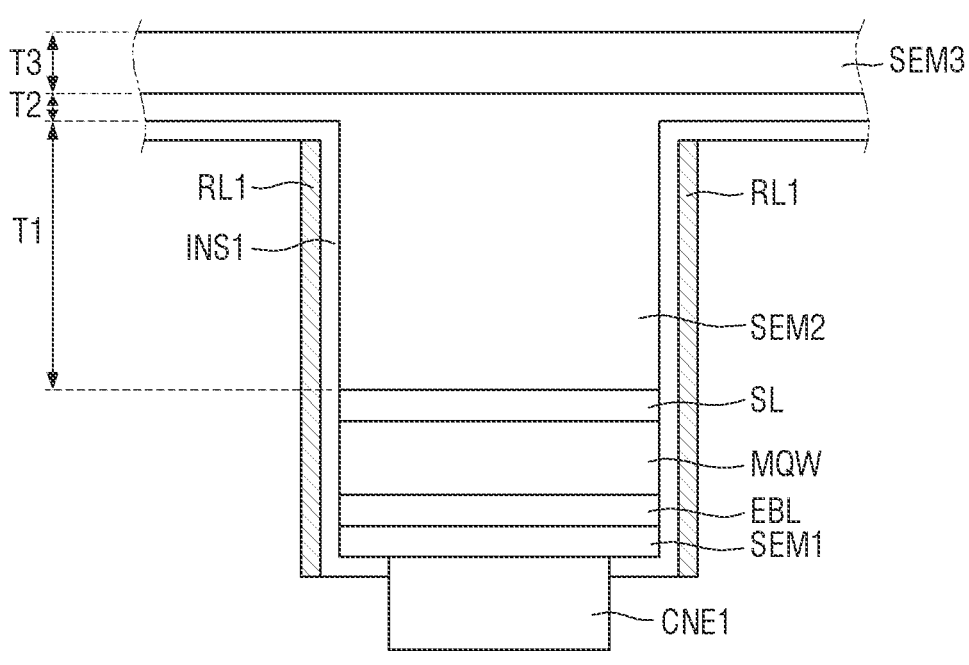
FIG. 14 is a cross-sectional view showing a light emitting element according to one embodiment.
Figure 15:
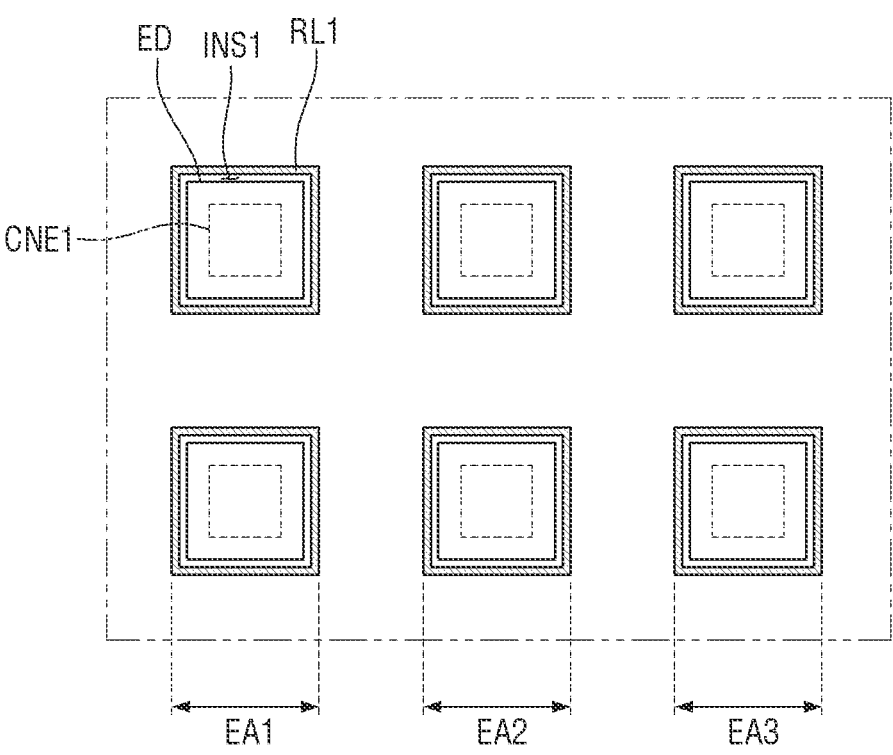
FIG. 15 is a plan view showing the arrangement of light emitting elements of a display device according to one embodiment.
Figure 15:
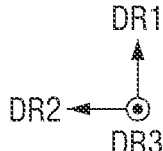
Figure 16:
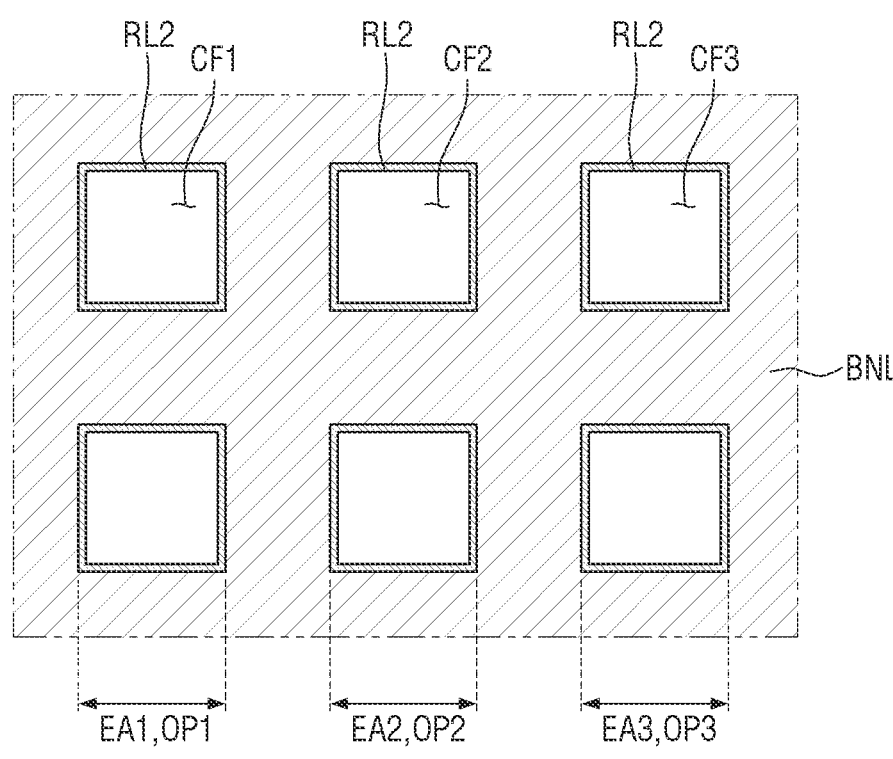
FIG. 16 is a plan view showing the arrangement of color filters of a display device according to one embodiment.
Figure 16:
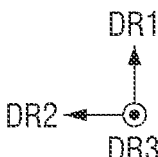

FIG. 13 is a cross-sectional view taken along the line L1-L1' of FIG. 8, FIG. 14 is a cross-sectional view showing a light emitting element according to one embodiment, FIG. 15 is a plan view showing the arrangement of light emitting elements of a display device according to one embodiment, and FIG. 16 is a plan view showing the arrangement of color filters of a display device according to one embodiment. FIG. 13 shows a cross section across the pad area PDA, the common electrode connection portion CPA, and one pixel PX of the display area DPA.

Referring to FIGS. 13 to 16 in conjunction with FIGS. 7 and 8, the display device 10 according to one embodiment may include the circuit substrate 100, the display substrate 300, the circuit board CB, the heat dissipation substrate 500, and the cover substrate 700.

The circuit substrate 100 includes a first substrate 110, the plurality of pixel circuit units PXC disposed on (or in) the first substrate 110, the plurality of electrodes AE and CE, the plurality of pads PD, and electrode connection portions CTE1 and CTE2. The display substrate 300 may include the plurality of light emitting elements ED disposed on the circuit substrate 100, a color control structure WCL, color filters CF1, CF2, and CF3, and a second substrate 310 disposed above the light emitting elements ED. The circuit board CB may include the circuit board pads PDC electrically connected to the plurality of pads PD of the circuit substrate 100 so that a part thereof may be disposed above the first substrate 110.

The first substrate 110 of the circuit substrate 100 may be a semiconductor circuit substrate. The first substrate 110, that is, a silicon wafer substrate formed by a semiconductor process, may include a plurality of pixel circuit units PXC. Each of the pixel circuit units PXC may be formed by the process of forming a semiconductor circuit on a silicon wafer. Each of the plurality of pixel circuit units PXC may include at least one transistor and at least one capacitor formed by the semiconductor process. For example, the plurality of pixel circuit units PXC may include a CMOS circuit.

The plurality of pixel circuit units PXC may be disposed in the display area DPA and the non-display area NDA. From among the plurality of pixel circuit units PXC, each of the pixel circuit units PXC disposed in the display area DPA may be electrically connected to a pixel electrode AE. The plurality of pixel circuit units PXC disposed in the display area DPA may be disposed to correspond to a plurality of pixel electrodes AE, respectively, and may overlap the light emitting elements ED disposed in the display area DPA in a third direction DR3, that is, the thickness direction.

From among the plurality of pixel circuit units PXC, each of the pixel circuit units PXC disposed in the non-display area NDA may be electrically connected to the common electrode CE. The plurality of pixel circuit units PXC disposed in the non-display area NDA may be disposed to correspond to the plurality of common electrodes CE, respectively, and may overlap the common electrode CE and a second connection electrode CNE2 disposed in the non-display area NDA in the third direction DR3.

A circuit insulating layer CINS may be disposed on the plurality of pixel circuit units PXC. The circuit insulating layer CINS may protect the plurality of pixel circuit units PXC and may flatten (e.g., may planarize) the stepped portions of the plurality of pixel circuit units PXC. The circuit insulating layer CINS may expose a part of each of the pixel electrodes AE to electrically connect the pixel electrodes AE to first connection electrodes CNE1. The circuit insulating layer CINS may include an inorganic insulating material, such as silicon oxide ($SiO_x$), silicon nitride ($SiN_x$), silicon oxynitride ($SiO_xN_y$), aluminum oxide ($AlO_x$), and aluminum nitride ($AlN_x$).

The plurality of pixel electrodes AE may be disposed in the display area DPA, and each of them may be disposed on the pixel circuit unit PXC corresponding thereto. Each of the pixel electrodes AE may be an exposed electrode that is formed integrally with the pixel circuit unit PXC and exposed from the pixel circuit unit PXC. The plurality of common electrodes CE may be disposed at the common electrode connection portion CPA in the non-display area NDA, and each of them may be disposed on the pixel circuit unit PXC corresponding thereto. The common electrode CE may be an exposed electrode that is formed integrally with the pixel circuit unit PXC and exposed from the pixel circuit unit PXC. Each of the pixel electrode AE and the common electrode CE may contain a metal material, such as aluminum (Al).

Each of a plurality of electrode connection portions CTE1 and CTE2 may be disposed on the pixel electrode AE or the common electrode CE. Each of the first electrode connection portions CTE1 may be disposed on the pixel electrode AE in the display area DPA. The first electrode connection portions CTE1 may be disposed to correspond to different pixel electrodes AE. Each of the second electrode connection portions CTE2 may be disposed at the common electrode connection portion CPA in the non-display area NDA to surround the display area DPA and may be disposed on the common electrode CE.

For example, each of the electrode connection portions CTE1 and CTE2 may be directly disposed on the pixel electrode AE or the common electrode CE to be in contact therewith. Each of the electrode connection portions CTE1 and CTE2 may be electrically connected to the pixel electrode AE or the common electrode CE, and the light emitting element ED. Further, the second electrode connection portion CTE2 may be electrically connected to any one of the plurality of pads PD through the pixel circuit unit PXC formed in the non-display area NDA.

Each of the electrode connection portions CTE1 and CTE2 may contain a material that allows for electrical connection with the pixel electrode AE or the common electrode CE, and the light emitting elements ED. For example, each of the electrode connection portions CTE1 and CTE2 may contain at least one of gold (Au), copper (Cu), aluminum (Al), or tin (Sn). In some embodiments, each of the electrode connection portions CTE1 and CTE2 may include a first layer containing any one of gold (Au), copper (Cu), aluminum (Al), and tin (Sn) and a second layer containing another one of gold (Au), copper (Cu), aluminum (Al), and tin (Sn).

The plurality of pads PD are disposed in the pad area PDA in the non-display area NDA. The plurality of pads PD are spaced apart from the common electrode CE and the second electrode connection portion CTE2. The plurality of pads PD may be spaced apart from the common electrode CE toward the outer side of the non-display area NDA.

Each of the pads PD may include a pad base layer PL and a pad upper layer PU. The pad base layer PL may be disposed on the first substrate 110, and the circuit insulating layer CINS may be disposed to expose the pad base layer PL. The pad upper layer PU may be directly disposed on the pad base layer PL.

The display substrate 300 is disposed on one surface of the circuit substrate 100. The plurality of light emitting elements ED of the display substrate 300 may be disposed to correspond to the plurality of first electrode connection portions CTE1 of the circuit substrate 100.

The plurality of light emitting elements ED may be disposed to respectively correspond to the emission areas EA1, EA2, and EA3 in the display area DPA. One light emitting element ED may be disposed to correspond to one of the emission areas EA1, EA2, and EA3.

The light emitting element ED may be disposed on the first electrode connection portion CTE1 in the display area DPA. The light emitting element ED may be an inorganic light emitting diode having a shape extending in one direction. The light emitting element ED may have a cylindrical shape that is longer in a width than in a height, a disc shape, or a rod shape. However, the present disclosure is not limited thereto, and the light emitting element ED may have various shapes, such as a rod shape, a wire shape, a tube shape, a polygonal prism shape, such as a regular cube, a rectangular parallelepiped, and a hexagonal prism, or a shape extending in one direction and having a partially inclined outer surface. For example, the light emitting element ED may have the length in the extension direction or the length in the third direction DR3 longer than the width in the horizontal direction, and the length in the third direction DR3 of the light emitting element ED may be in a range of about 1 μm to about 5 μm.

In accordance with one embodiment, the light emitting element ED may include the first connection electrode CNE1, a first semiconductor layer SEM1, an electron blocking layer EBL, an active layer MQW, a superlattice layer SL, and a second semiconductor layer SEM2. The first connection electrode CNE1, the first semiconductor layer SEM1, the electron blocking layer EBL, the active layer MQW, the superlattice layer SL, and the second semiconductor layer SEM2 may be sequentially stacked in the third direction DR3.

The first connection electrode CNE1 may be disposed on the first electrode connection portion CTE1. The first connection electrode CNE1 may be in direct contact with the first electrode connection portion CTE1 and may transmit the light emitting signal applied from the pixel electrode AE to the light emitting element ED. The first connection electrode CNE1 may be an ohmic connection electrode. However, the present disclosure is not limited thereto, and the first connection electrode CNE1 may be a Schottky connection electrode. The light emitting element ED may include at least one first connection electrode CNE1.

When the light emitting element ED is electrically connected to the electrode connection portions CTE1 and CTE2, the first connection electrode CNE1 may reduce a resistance due to the contact between the light emitting element ED and the electrode connection portions CTE1 and CTE2. The first connection electrode CNE1 may contain a conductive metal. For example, the first connection electrode CNE1 may include at least one of gold (Au), copper (Cu), tin (Sn), titanium (Ti), aluminum (Al), or silver (Ag). For example, the first connection electrode CNE1 may contain a 9:1 alloy, an 8:2 alloy or a 7:3 alloy of gold and tin or may contain an alloy of copper, silver, and tin, such as SAC305, which includes 96.5% tin, 3% silver, and 0.5% copper.

The first semiconductor layer SEM1 may be disposed on the first connection electrode CNE1. The first semiconductor layer SEM1 may be a p-type semiconductor and may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material of the first semiconductor layer SEM1 may be any one or more of p-type doped AlGaInN, GaN, AlGaN, InGaN, AlN, and InN. The first semiconductor layer SEM1 may be doped with a p-type dopant, and the p-type dopant may be Mg, Zn, Ca, Se, Ba, or the like. For example, the first semiconductor layer SEM1 may be p-GaN doped with p-type Mg.

The electron blocking layer EBL may be disposed on the first semiconductor layer SEM1. The electron blocking layer EBL may prevent (or substantially prevent) electrons flowing into the active layer MQW from being injected into another layer without being recombined with holes in the active layer MQW. For example, the electron blocking layer EBL may be p-AlGaN doped with p-type Mg. The thickness of the electron blocking layer EBL may be within a range of about 10 nm to about 50 nm, but the present disclosure is not limited thereto. In some embodiments, the electron blocking layer EBL may be omitted.

The active layer MQW may be disposed on the electron blocking layer EBL. The active layer MQW may emit light due to recombination of the electrons and the holes in response to the light emitting signal applied through the first semiconductor layer SEM1 and the second semiconductor layer SEM2. In one embodiment, the light emitting element ED of the display device 10 may emit light of a third color (e.g., blue light), in which the active layer MQW emits light having a central wavelength band of about 450 nm to about 495 nm.

The active layer MQW may include a material having a single or multiple quantum well structure. When the active layer MQW contains a material having a multiple quantum well structure, the active layer MQW may have a structure in which a plurality of well layers and barrier layers are alternately laminated. For example, the well layer may be formed of InGaN, and the barrier layer may be formed of GaN or AlGaN, but the present disclosure is not limited thereto.

For example, the active layer MQW may have a structure in which semiconductor materials having large band gap energy and semiconductor materials having small band gap energy are alternately stacked and may include other group III to V semiconductor materials according to the wavelength band of the emitted light. The light emitted from the active layer MQW is not limited to the third color (e.g., to blue light). In some embodiments, the first color (e.g., red light) or the second color (e.g., green light) may be emitted.

The superlattice layer SL is disposed on the active layer MQW. The superlattice layer SL may reduce stress due to the difference in lattice constant between the second semiconductor layer SEM2 and the active layer MQW. For example, the superlattice layer SL may be formed of InGaN or GaN. The thickness of the superlattice layer SL may be about 50 nm to about 200 nm. In some embodiments, the superlattice layer SL may be omitted.

The second semiconductor layer SEM2 may be disposed on the superlattice layer SL. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material of the second semiconductor layer SEM2 may be any one or more of n-type doped AlGaInN, GaN, AlGaN, InGaN, AlN, and InN. The second semiconductor layer SEM2 may be doped with an n-type dopant, and the n-type dopant may be Si, Ge, Sn, or the like. For example, the second semiconductor layer SEM2 may be n-GaN doped with n-type Si. The thickness of the second semiconductor layer SEM2 may be within a range of about 2 μm to about 4 μm, but the present disclosure is not limited thereto.

In one embodiment, the second semiconductor layers SEM2 of the plurality of light emitting elements ED of the display device 10 may be connected to each other. The plurality of light emitting elements ED may share a part of the second semiconductor layer SEM2 as one common layer, and the plurality of layers disposed on the second semiconductor layer SEM2 may be spaced apart from each other. The second semiconductor layer SEM2 may include a base layer disposed in the display area DPA and a part of the non-display area NDA while extending in the first direction DR1 and the second direction DR2, and a plurality of protrusions partially protruding from the base layer and spaced apart from each other. The layers of the light emitting element ED may be formed as patterns disposed on the protrusion of the second semiconductor layer SEM2 and spaced apart from each other, and they may form one light emitting element ED together with the protrusion of the second semiconductor layer SEM2. A thickness T1 of the protrusion of the second semiconductor layer SEM2 forming a part of the light emitting element ED may be greater than a thickness T2 of the base layer that does not overlap the first semiconductor layer SEM1 (e.g., that extends over and beyond the first semiconductor layer SEM1).

The second semiconductor layer SEM2 may transmit the light emitting signal applied through the second connection electrode CNE2 and the second electrode connection portion CTE2 to the plurality of light emitting elements ED. As will be described later, the second connection electrode CNE2 may be disposed on one surface of the base layer of the second semiconductor layer SEM2 of the plurality of light emitting elements ED that is disposed in the non-display area NDA and may be electrically connected to the common electrode CE through the second electrode connection portion CTE2.

A third semiconductor layer SEM3 is disposed on the second semiconductor layer SEM2 of the light emitting elements ED. The third semiconductor layer SEM3 may be disposed in the display area DPA and a part of the non-display area NDA, and the second semiconductor layer SEM2 may be disposed on the entire base layer. The third semiconductor layer SEM3 may be an undoped semiconductor. The third semiconductor layer SEM3 may contain the same material as that of the second semiconductor layer SEM2 and may contain a material that is not doped with an n-type or p-type dopant. In an embodiment, the third common semiconductor layer SEM3 may be, but is not limited to, at least one of undoped InAlGaN, GaN, AlGaN, InGaN, AlN, or InN.

Different from the second semiconductor layer SEM2, the third semiconductor layer SEM3 may not have conductivity (e.g., may not be conductive), and the light emitting signal applied to the pixel electrode AE and the common electrode CE may flow through the light emitting element ED and the second semiconductor layer SEM2. In the manufacturing process of the light emitting element ED, the second semiconductor layer SEM2 and the plurality of light emitting elements ED may be formed on the third semiconductor layer SEM3. A thickness T3 of the third semiconductor layer SEM3 may be smaller than the thickness T1 of the protrusion of the second semiconductor layer SEM2 and may be greater than the thickness T2 of the base layer of the second semiconductor layer SEM2.

A plurality of second connection electrodes CNE2 may be disposed at the common electrode connection portion CPA in the non-display area NDA. The second connection electrode CNE2 may be disposed on one surface of the base layer of the second semiconductor layer SEM2. Further, the second connection electrode CNE2 may be directly disposed on the second electrode connection portion CTE2 and may transmit the light emitting signal applied from the common electrode CE to the light emitting element ED. The second connection electrode CNE2 may be made of the same material as that of the first connection electrodes CNE1. The thickness of the second connection electrode CNE2 in the third direction DR3 may be greater than the thickness of the first connection electrode CNE1.

A first insulating layer INS1 may be disposed on one surface of the base layer of the second semiconductor layer SEM2 and the side surfaces of the light emitting elements ED. The first insulating layer INS1 may be disposed to surround at least the light emitting elements ED. The portions of the first insulating layer INS1 surrounding the light emitting elements ED are disposed to respectively correspond to the light emitting elements ED and, thus, may be spaced apart from each other in the first direction DR1 and the second direction DR2 in a plan view. The first insulating layer INS1 may protect each of the plurality of light emitting elements ED and may insulate the second semiconductor layer SEM2 and the light emitting elements ED from other layers. The first insulating layer INS1 may include an inorganic insulating material, such as silicon oxide ($SiO_x$), silicon nitride ($SiN_x$), silicon oxynitride ($SiO_xN_y$), aluminum oxide ($AlO_y$), and aluminum nitride ($AlN_x$).

A first reflective layer RL1 may be disposed to surround the side surfaces of the plurality of light emitting elements ED. The first reflective layer RL1 may be disposed to correspond to each of the emission areas EA1, EA2, and EA3 in the display area DPA and may be directly disposed on the first insulating layer INS1 disposed on the side surface of the light emitting element ED. Because the first reflective layers RL1 are disposed to surround the light emitting elements ED spaced apart from each other while corresponding thereto, different first reflective layers RL1 may be spaced apart from each other in the first direction DR1 and the second direction DR2 in a plan view. The first reflective layer RL1 may reflect the light emitted from the active layer MQW of the light emitting element ED such that the reflected light may travel toward the second substrate 310 instead of the first substrate 110.

The first reflective layer RL1 may contain a metal material having high reflectivity, such as aluminum (Al). The thickness of the first reflective layer RL1 may be about 0.1 μm but is not limited thereto.

A protective layer PTF, the color control structure WCL, the color filters CF1, CF2, and CF3, a second reflective layer RL2, the bank layer BNL, and the second substrate 310 are disposed above the light emitting elements ED of the display substrate 300. In the following description, the layers disposed on one surface of the second substrate 310 facing the first substrate 110 will be sequentially described.

The second substrate 310 may be disposed to face the first substrate 110. The second substrate 310 may be a base substrate supporting the plurality of layers included in the display substrate 300. The second substrate 310 may be made of a transparent material. For example, the second substrate 310 may include a transparent substrate, such as a sapphire substrate, glass, or the like. However, the present disclosure is not limited thereto, and it may be formed of a conductive substrate, such as GaN, SiC, ZnO, Si, GaP, and GaAs.

The bank layer BNL may be disposed on one surface of the second substrate 310. The bank layer BNL may be disposed to surround the first emission area EA1, the second emission area EA2, and the third emission area EA3. The bank layer BNL may include portions extending in the first direction DR1 and the second direction DR2 to form a lattice pattern in the entire display area DPA. The bank layer BNL may also be disposed in the non-display area NDA and may be disposed to completely cover one surface of the second substrate 310 in the non-display area NDA.

The bank layer BNL may have a plurality of openings OP1, OP2, and OP3 exposing the second substrate 310 in the display area DPA. The plurality of openings OP1, OP2, and OP3 may include a first opening OP1 overlapping the first emission area EA1, a second opening OP2 overlapping the second emission area EA2, and a third opening OP3 overlapping the third emission area EA3. The plurality of openings OP1, OP2, and OP3 may correspond to the plurality of emission areas EA1, EA2, and EA3, respectively.

In one embodiment, the bank layer BNL may contain silicon (Si). For example, the bank layer BNL may include a silicon monocrystalline layer. The bank layer BNL containing silicon may be formed by a reactive ion etching (RIE) process. The bank layer BNL may be formed to have a high aspect ratio by adjusting the process conditions of the etching process.

On one surface of the second substrate 310, the plurality of color filters CF1, CF2, and CF3 may be disposed in the plurality of openings OP1, OP2, and OP3 of the bank layer BNL, respectively. Different color filters CF1, CF2, and CF3 may be spaced apart from each other with the bank layer BNL interposed therebetween, but the present disclosure is not limited thereto.

The plurality of color filters CF1, CF2, and CF3 may include a first color filter CF1, a second color filter CF2, and a third color filter CF3. The first color filter CF1 may be disposed in the first opening OP1 in the bank layer BNL to overlap the first emission area EA1. The second color filter CF2 may be disposed in the second opening OP2 i the bank layer BNL to overlap the second emission area EA2, and the third color filter CF3 may be disposed in the third opening OP3 in the bank layer BNL to overlap the third emission area EA3.

The plurality of color filters CF1, CF2, and CF3 may be disposed to fill the openings OP1, OP2, and OP3, respectively, and one surface of the color filters CF1, CF2, and CF3 may parallel to one surface of the bank layer BNL. For example, the thicknesses of the color filters CF1, CF2, and CF3 may be the same as the thickness of the bank layer BNL. However, the present disclosure is not limited thereto, and the one surface of the color filters CF1, CF2, and CF3 may protrude or be recessed from the one surface of the bank layer BNL. For example, the thicknesses of the color filters CF1, CF2, and CF3 may be different from the thickness of the bank layer BNL.

The color filters CF1, CF2, and CF3 may be disposed in island-shaped patterns to correspond to the openings OP1, OP2, and OP3 of the bank layer BNL, respectively, but the present disclosure is not limited thereto. For example, each of the color filters CF1, CF2, and CF3 may form a linear pattern extending in one direction in the display area DPA. In such an embodiment, the openings OP1, OP2, and OP3 in the bank layer BNL may also extend in one direction. In one embodiment, the first color filter CF1 may be a red color filter, the second color filter CF2 may be a green color filter, and the third color filter CF3 may be a blue color filter. Each of the color filters CF1, CF2, and CF3 may transmit some of the light emitted from the light emitting element ED that pass through the color control structure WCL and may block the transmission of other light.

The second reflective layer RL2 may be disposed in the plurality of openings OP1, OP2, and OP3 in the bank layer BNL. The second reflective layer RL2 may be disposed on the side surface of the bank layer BNL and may surround the side surfaces of the color filters CF1, CF2, and CF3 respectively disposed in the openings OP1, OP2, and OP3. The second reflective layer RL2 may be disposed in different openings OP1, OP2, and OP3 to surround different color filters CF1, CF2, and CF3, and the plurality of second reflective layers RL2 may be spaced apart from each other in the first direction DR1 and the second direction DR2 in a plan view.

The second reflective layer RL2 may reflect incident light similarly to the first reflective layer RL1. Some of the light emitted from the light emitting element ED and incident on the color filters CF1, CF2, and CF3 may be reflected by the second reflective layer RL2 and may be emitted toward the top surface of the second substrate 310. The second reflective layer RL2 may contain the same material as that of the first reflective layer RL1 and may contain, for example, a metal material having high reflectivity, such as aluminum (Al). The thickness of the second reflective layer RL2 may be about 0.1 mm but is not limited thereto.

The color control structure WCL may be disposed on the plurality of color filters CF1, CF2, and CF3. A plurality of color control structures WCL may be disposed to overlap the first color filter CF1, the second color filter CF2, and the third color filter CF3, respectively, and may be spaced apart from each other. The color control structures WCL may be disposed to respectively correspond to the plurality of openings OP1, OP2, and OP3 in the bank layer BNL. In one embodiment, the color control structures WCL may overlap the plurality of openings OP1, OP2, and OP3, respectively. The color control structures WCL may form island-shaped patterns spaced apart from each other. However, the present disclosure is not limited thereto, and the color control structures may form a linear pattern extending in one direction.

The color control structure WCL may change (or shift) the peak wavelength of incident light to another peak wavelength and emit it. In the embodiment in which the light emitting element ED emits a third color light (e.g., blue light), the color control structure WCL may change at least a part of the light emitted from the light emitting element ED to a fourth color light (e.g., yellow light). A part of the third color light emitted from the light emitting element ED may be converted to the fourth color light by the color control structure WCL, and the mixed third color light and fourth color light may be incident on each of the color filters CF1, CF2, and CF3. The first color filter CF1 may transmit the first color light (e.g., red light) from among the mixed third and fourth color light and may block the transmission other color light. Similarly, the second color filter CF2 may transmit the second color light (e.g., green light) from among the mixed third and fourth color light and may block the transmission of other color light, and the third color filter CF3 may transmit the third color light (e.g. blue light) from among the mixed third and fourth color light and may block the transmission of other color light.

Each of the color control structures WCL may contain a base resin BRS and wavelength conversion particles WCP. The base resin BRS may contain a transparent organic material. For example, the base resin BRS may contain an epoxy resin, an acrylic resin, a cardo resin, or an imide resin. The base resin BRS of the color control structures WCL may be made of the same material, but the present disclosure is not limited thereto. The wavelength conversion particles WCP may be materials that convert the third color light (e.g., blue light) into the fourth color light (e.g., yellow light).

The wavelength conversion particles WCP may be quantum dots, quantum rods, or fluorescent substances. Examples of the quantum dot may include group IV nanocrystal, group II-V1 compound nanocrystal, group III-V compound nanocrystal, group IV-VI nanocrystal, and a combination thereof.

Further, each of the color control structures WCL may further include a scatterer. The scatterer may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The content of the wavelength conversion particles WCP contained in the color control structure WCL increases as the thickness of the color control structure WCL in the third direction DR3 increases so that the light conversion efficiency of the color control structure WCL may be increased. The thickness of the color control structure WCL may be designed in consideration of the light conversion efficiency of the wavelength conversion particles WCP.

The protective layer PTF may be disposed on the bank layer BNL and the color control structure WCL to cover them. The protective layer PTF may be disposed across the entire display area DPA and the entire non-display area NDA. The protective layer PTF may protect the color control structure WCL in the display area DPA and may flatten (e.g., may planarize) the stepped portion formed by the color control structure WCL.

The protective layer PTF may be disposed between the light emitting element ED and the color control structure WCL and may prevent the wavelength conversion particles WCP of the color control structure WCL from being damaged by the heat generated by the light emitting element ED. The protective layer PTF may contain an organic insulating material, for example, an epoxy resin, an acrylic resin, a cardo resin, or an imide resin.

An adhesive layer ADL may be disposed between the protective layer PTF and the third semiconductor layer SEM3 of the display substrate 300. The adhesive layer ADL may bond the third semiconductor layer SEM3 and the protective layer PTF to each other and may be made of a transparent material such that light emitted from the light emitting element ED passes therethrough. For example, the adhesive layer ADL may contain an acrylic material, a silicon material, a urethane material, or the like and may contain a UV curable or a thermosetting material.

As described above, the cover substrate 700 may be partially disposed on the circuit board CB and may be coupled to the heat dissipation substrate 500 by the clamping part 800. The pads PD of the circuit substrate 100 may be in direct contact with the circuit board pads PDC of the circuit board CB. As an example, an upper pad layer PU of the pad PD may be in direct contact with the circuit board pad PDC, and the physical interface may exist therebetween.

Further, the cover substrate 700 may be disposed on a part of the circuit board CB where the circuit board pads PDC are disposed. The cover substrate 700 may also include an opening corresponding to the display substrate 300 and may not overlap the display substrate 300. The display substrate 300 may have a sufficiently large thickness, and the top surface thereof may protrude from the top surface of the cover substrate 700.

Hereinafter, various embodiments of the display device 10 will be described with reference to other drawings.

Figure 17:
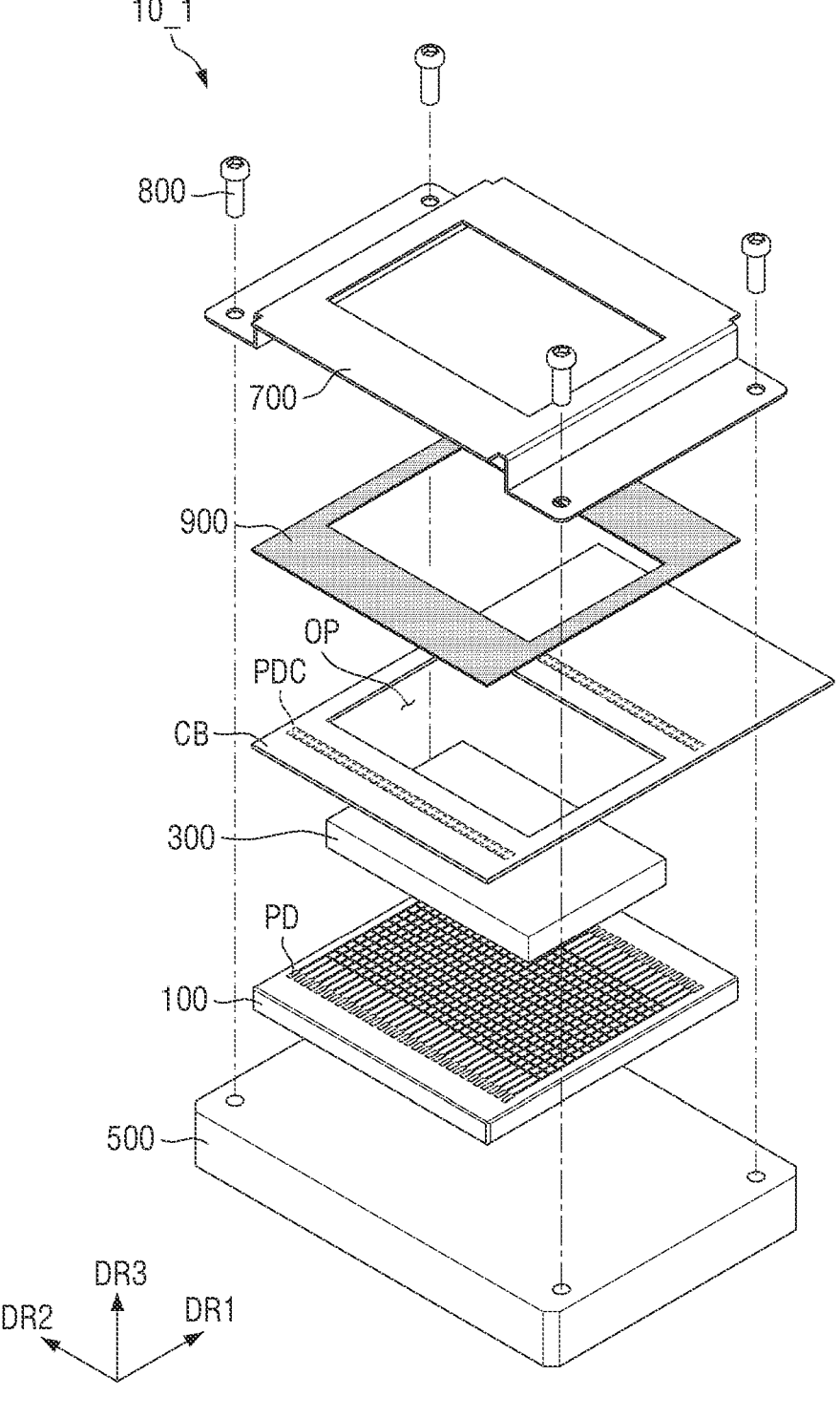
FIG. 17 is an exploded perspective view of a display device according to another embodiment.
Figure 18:
FIG. 18 is a cross-sectional view of the display device shown in FIG. 17 taken in the first direction.
Figure 18:
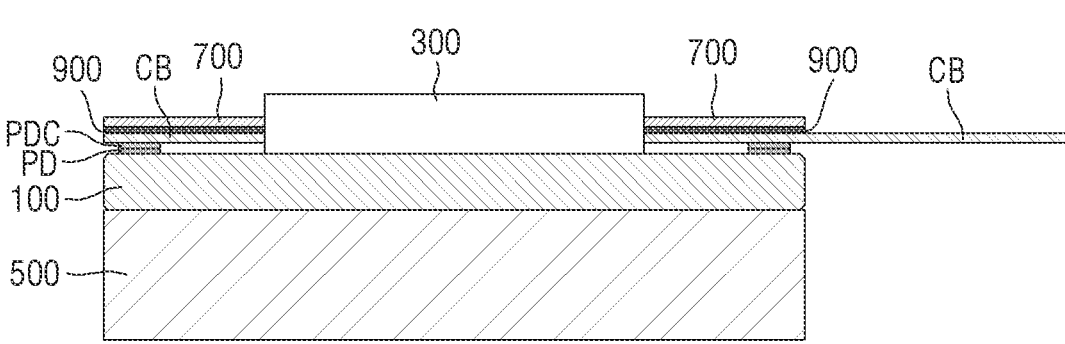
Figure 18:
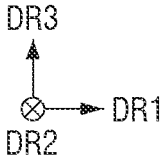
Figure 19:
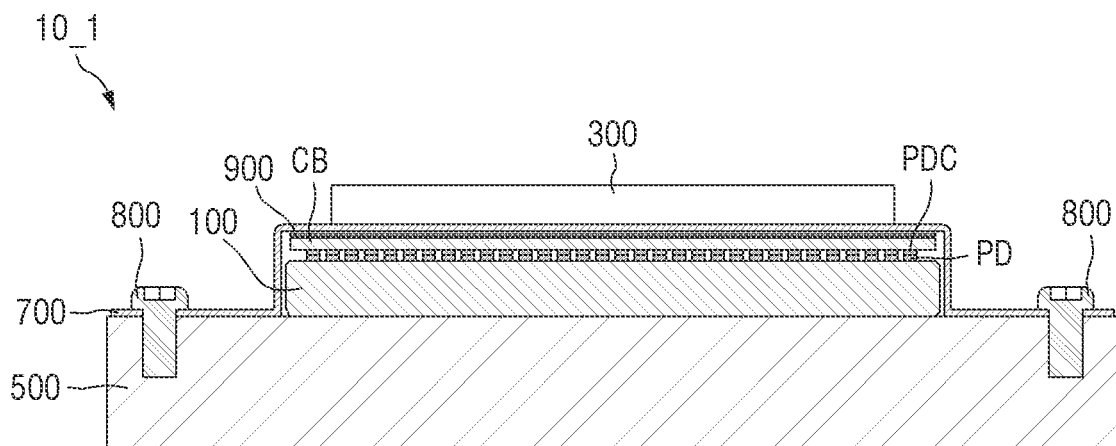
FIG. 19 is a cross-sectional view of the display device shown in FIG. 17 taken in the second direction.
Figure 19:
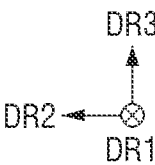

FIG. 17 is an exploded perspective view of a display device according to another embodiment, FIG. 18 is a cross-sectional view of the display device shown in FIG. 17 taken in the first direction, and FIG. 19 is a cross-sectional view of the display device shown in FIG. 17 taken in the second direction.

Referring to FIGS. 17 to 19, a display device 10_1 according to one embodiment may further include a cushion layer 900 disposed between the cover substrate 700 and the circuit board CB. The cushion layer 900 may uniformly transmit a force, applied to the circuit board CB when the cover substrate 700 is coupled to the heat dissipation substrate 500, to a region of the circuit substrate 100 overlapping the cover substrate 700.

When the cover substrate 700 is disposed on the circuit board CB to be in direct contact therewith, the circuit board CB may be partially damaged due to the force applied to the cover board CB while the cover substrate 700 and the heat dissipation substrate 500 are coupled to each other. In addition, the strength of the force applied from the cover substrate 700 to the circuit board CB may vary for each location depending on a fastening force of the clamping part 800. By further including the cushion layer 900, the display device 10_1 may protect the circuit board CB and may more uniformly transmit the force applied to the circuit board CB to the region of the circuit substrate 100 overlapping the cover substrate 700.

The cushion layer 900 may have a shape corresponding to the circuit board CB and the region of the circuit substrate 100 overlapping the cover substrate 700.

The cushion layer 900 may have substantially the same shape as the circuit board CB may have an opening corresponding to the display substrate 300. The cushion layer 900 may not overlap the display substrate 300, in the same way as the circuit board CB. However, the length of the cushion layer 900 measured in the first direction DR1 may be shorter than that of the circuit board CB and may be substantially the same as that of the circuit substrate 100. The cushion layer 900 may be disposed to overlap the circuit board pads PDC and the pads PD in the thickness direction and may uniformly (or more uniformly) transmit the force applied from the cover substrate 700 to an overlapping region of the circuit board pads PDC and the pads PD.

According to one embodiment, the cushion layer 900 may be made of a material more flexible than the cover substrate 700. For example, the cushion layer 900 may be made of a material, such as silicone, urethane, or acrylic rubber. The cushion layer 900 may be made of a material having a lower hardness than the cover substrate 700, which may be made of a metal material or plastic, to buffer and uniformly transmit the applied force to the entire region. Further, the cushion layer 900 may include a light blocking material to prevent light generated from the display substrate 300 from being emitted to the side rather than the upward direction. In addition to protecting the circuit board CB and uniformly transmitting the force, the cushion layer 900 may prevent leakage of light emitted from the display substrate 300.

Figure 20:
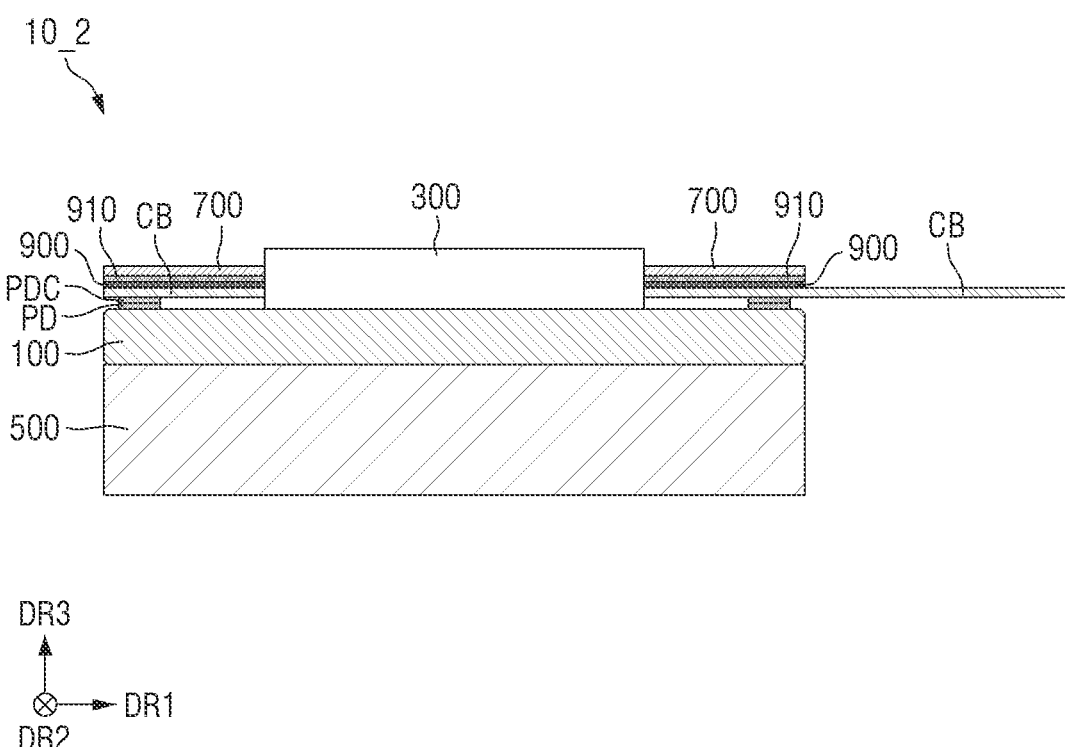
FIG. 20 is a cross-sectional view of a display device according to another embodiment.

FIG. 20 is a cross-sectional view of a display device according to another embodiment.

Referring to FIG. 20, a display device 10_2 according to one embodiment may further include a shielding layer 910 disposed between the cover substrate 700 and the circuit board CB. The shielding layer 910 may have substantially the same shape as the cushion layer 900 or the cover substrate 700. The shielding layer 910 may have an opening formed to correspond to the display substrate 300 and may not overlap the display substrate 300 in the thickness direction. According to one embodiment, the shielding layer 910 may be made of a metal material and may be disposed around the display substrate 300. The shielding layer 910 may overlap the circuit substrate 100 while surrounding the display substrate 300 and may protect the circuit substrate 100 and the display substrate 300 from static electricity.

The display device 10_2, as shown in FIG. 20, includes the shielding layer 910 that is separately disposed between the cushion layer 900 and the cover substrate 700, but the present disclosure is not limited thereto. The shielding layer 910 may not be disposed as the separate layer but may be coated on the bottom surface of the cover substrate 700. In some embodiments, the cover substrate 700 may protect the circuit substrate 100 and the display substrate 300 from static electricity, similar to the shielding layer 910. In such an embodiment, the cover substrate 700 may be made of a plastic material including metal.

Figure 21:
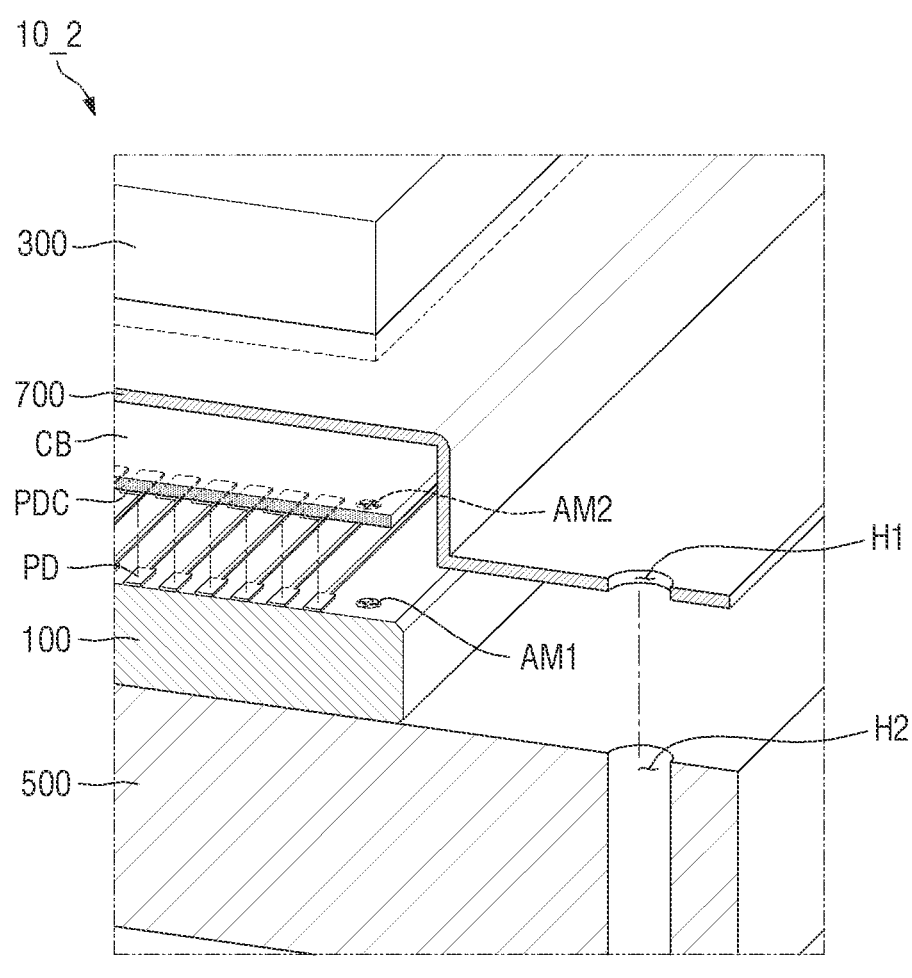
FIG. 21 is a partial enlarged view of a display device according to still another embodiment in an exploded view.
Figure 21:
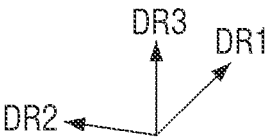

FIG. 21 is a partial enlarged view of a display device according to another embodiment in an exploded view.

Referring to FIG. 21, the display device 10_2 according to one embodiment may include a plurality of alignment patterns AM1 and AM2 disposed on the circuit substrate 100 and the circuit board CB. Similar to aligning the cover substrate 700 and the heat dissipation substrate 500 with each other by using the plurality of holes H1 and H2 in the manufacturing process of the display device 10_2, the circuit substrate 100 and the circuit board CB may be aligned with each other using the alignment patterns AM1 and AM2. The circuit substrate 100 may include a first alignment pattern AM1 disposed on the top surface thereof, on which the plurality of pads PD are disposed. The circuit board CB may include a second alignment pattern AM2 disposed on the bottom surface thereof, on which the plurality of circuit board pads PDC are disposed. Similar to the plurality of pads PD and the plurality of circuit board pads PDC, the first alignment pattern AM1 and the second alignment pattern AM2 may be located to overlap each other. it is illustrated in FIG. 21 that one first alignment pattern AM1 and one second alignment pattern AM2 are disposed on the circuit substrate 100 and the circuit board CB, respectively, but the present disclosure is not limited thereto. The plurality of alignment patterns AM1 and the plurality of alignment patterns AM2 may be respectively disposed on the circuit substrate 100 and the circuit board CB.

The locations and alignment of the first alignment pattern AM1 and the second alignment pattern AM2 may correspond to the alignment of the pads PD and the circuit board pads PDC. The alignment patterns AM1 and AM2 of the circuit substrate 100 and the circuit board CB may be arranged such that, when they are aligned with each other, the pads PD and the circuit board pads PDC may be aligned with each other. Because the display device 10_2 further includes the alignment patterns AM1 and AM2, the circuit substrate 100 and the circuit board CB may be precisely aligned with each other and misalignment, a contact defect, and the like of the pads PD and the circuit board pads PDC may be avoided.

Figure 22:
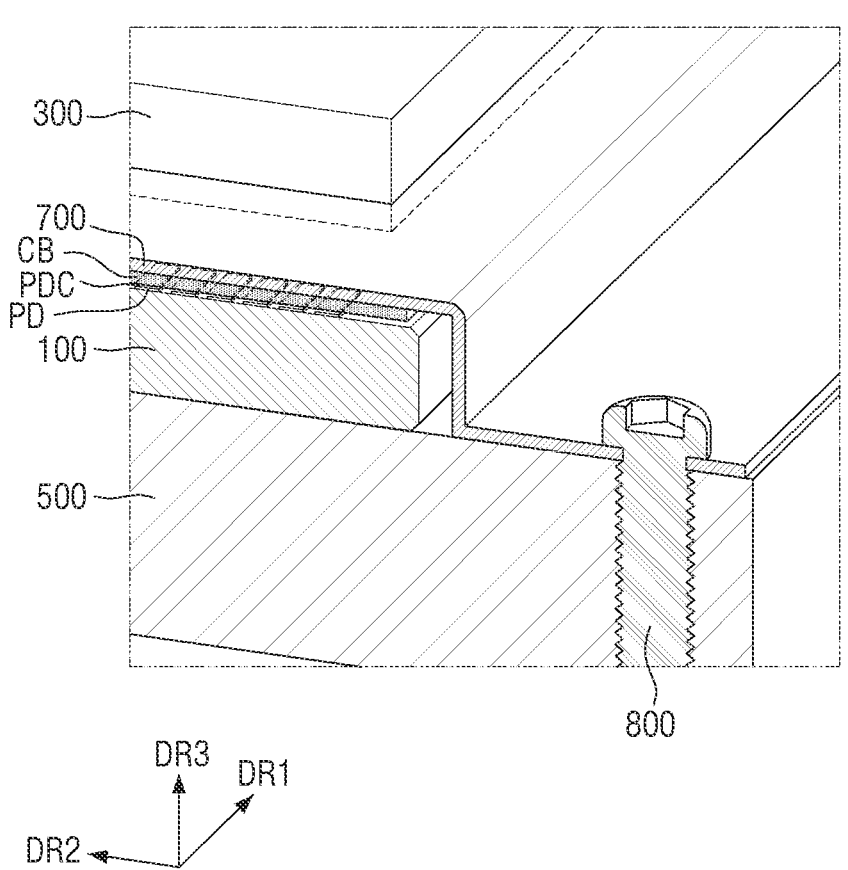
FIGS. 22 and 23 are partial enlarged views of a display device according to other embodiments in a state in which respective layers are combined.
Figure 23:
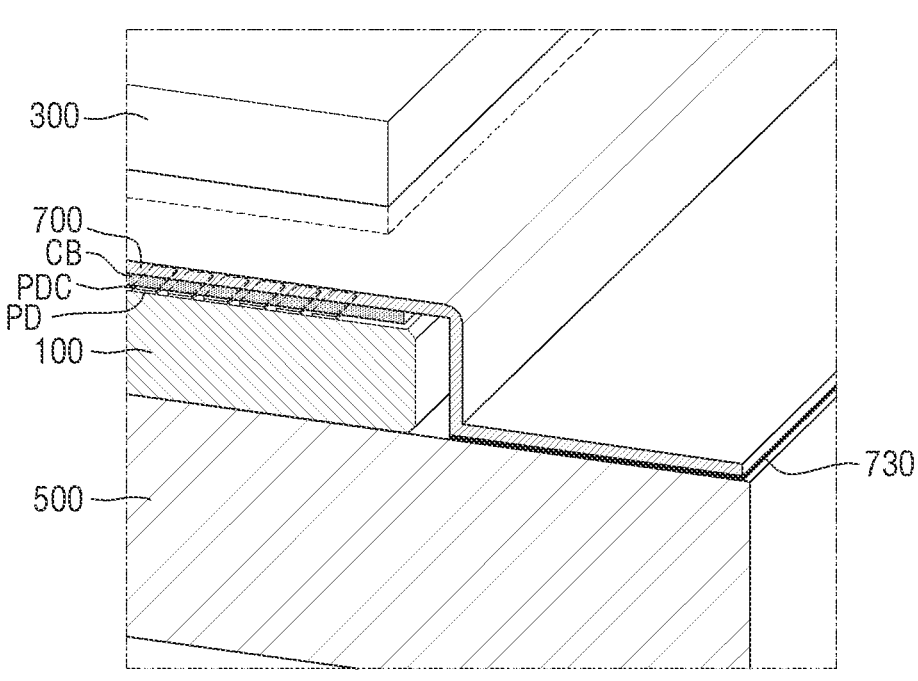
Figure 23:
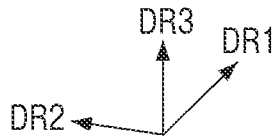

FIGS. 22 and 23 are partial enlarged views of a display device according to other embodiments in a state in which respective layers are combined.

As shown in FIG. 6, in the display device 10, the cover substrate 700 and the heat dissipation substrate 500 are exemplified to be coupled with each other by a fastening member such as a rivet, but the present disclosure is not limited thereto. The display device 10 may include various fastening members for increasing the fastening force between the heat dissipation substrate 500 and the cover substrate 700.

Referring to FIG. 22, in the display device 10 according to one embodiment, the clamping part 800 may be a fastening member, such as a bolt, and the heat dissipation substrate 500 may include a thread formed in the second hole H2. Because the display device 10 includes the clamping part 800, such as a bolt, to couple the cover substrate 700 and the heat dissipation substrate 500 to each other, the circuit board CB and the circuit substrate 100 may be more firmly fixed together.

Referring to FIG. 23, in the display device 10 according to one embodiment, the clamping part 800 may be omitted, and the cover substrate 700 and the heat dissipation substrate 500 may be coupled to each other via an adhesive member 730. The first hole H1 and the second hole H2 may be omitted from the cover substrate 700 and the heat dissipation substrate 500, and the adhesive member 730 may be disposed therebetween.

A display device for displaying an image according to one embodiment may be applied to various apparatuses and devices.

Figure 24:
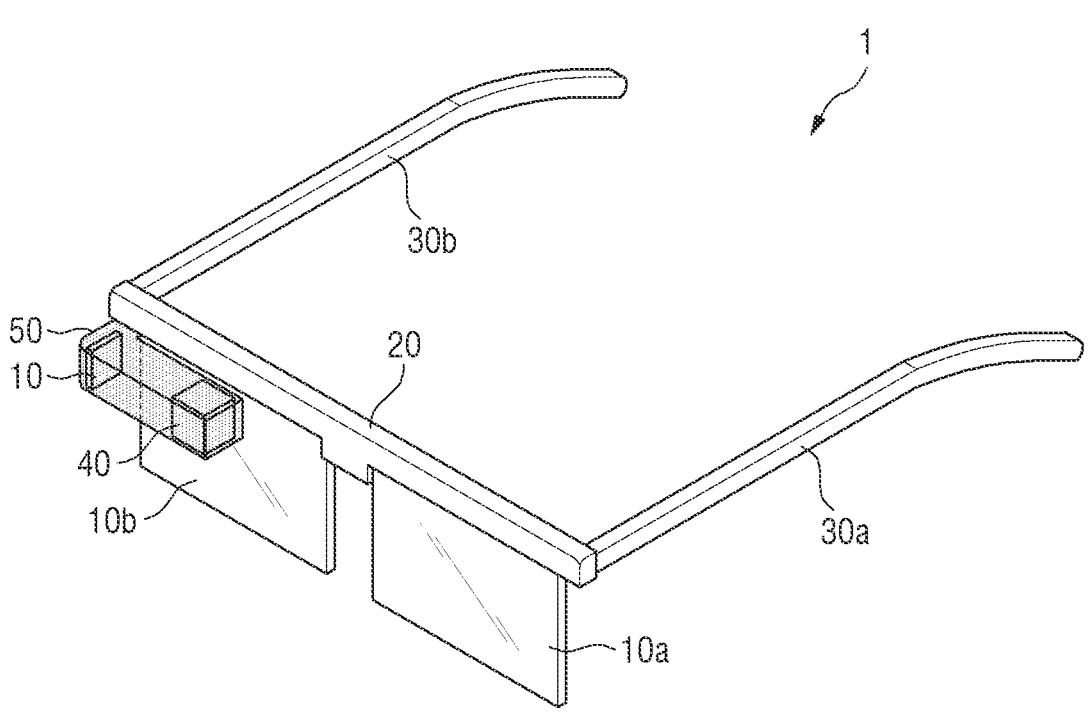
FIGS. 24 to 26 are schematic views showing a device including a display device according to embodiments.
Figure 25:
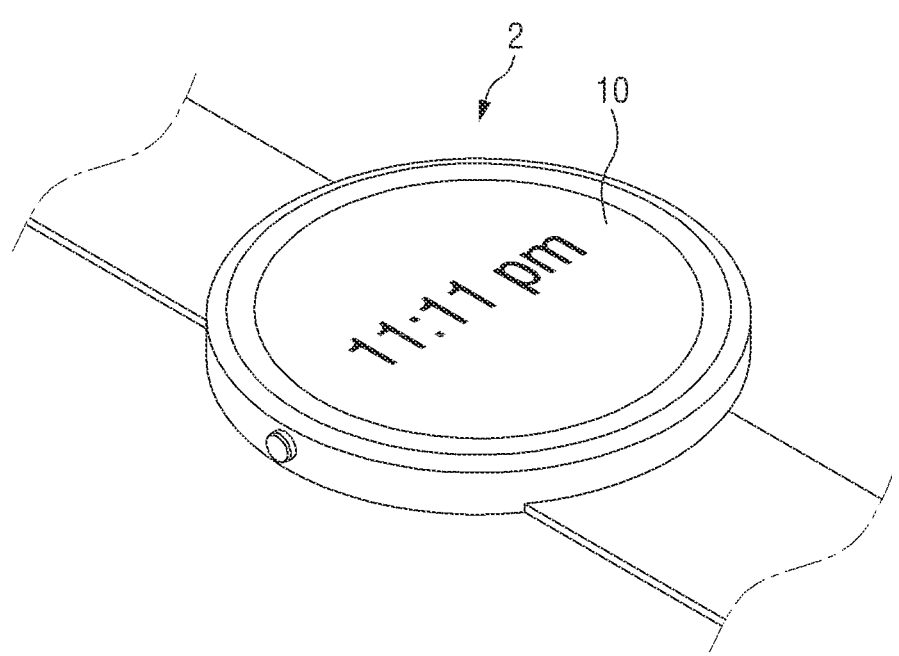
Figure 26:
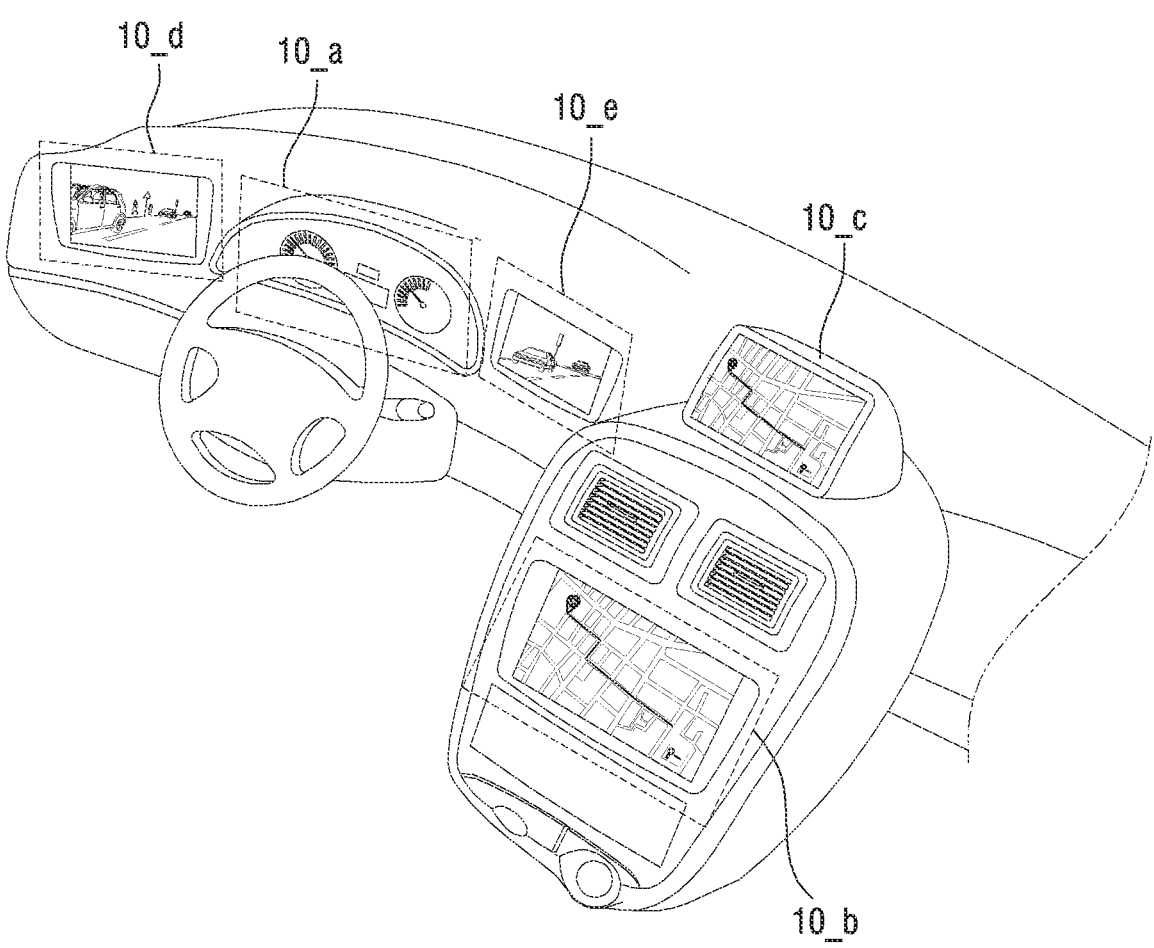

FIGS. 24 to 26 are schematic views showing devices including a display device according to embodiments.

FIG. 24 shows a virtual reality device 1 to which the display device 10 according to one embodiment is applied, and FIG. 25 shows a smart watch 2 to which the display device 10 according to one embodiment is applied. FIG. 26 shows that display devices 10_a, 10_b, 10_c, 10_d, and 10_e according to one embodiment are applied to the display unit of an automobile.

Referring to FIG. 24, the virtual reality device 1 according to one embodiment may be a glass-type device. The virtual reality device 1 according to one embodiment may include the display device 10, a left lens 10a, a right lens 10b, a support frame 20, temples 30a and 30b, a reflection member 40, and a display device storage 50.

Although the virtual reality device 1 including the temples 30a and 30b is illustrated, the virtual reality device 1 according to one embodiment may be applied to a head mounted display including a head mounted band that may be worn on a head, instead of the temples 30*a* and 30*b*. The virtual reality device 1 according to one embodiment is not limited to the structure shown in the drawing and may be applied in various forms to various electronic devices.

The display device storage 50 may include the display device 10 and the reflection member 40. The image displayed on the display device 10 may be reflected by the reflection member 40 and provided to a user's right eye through the right lens 10*b*. Accordingly, the user can view the virtual reality image displayed on the display device 10 through the right eye.

The display device storage 50 may be, but not necessarily, disposed at the right end of the support frame 20. In another embodiment, for example, the display device storage 50 may be disposed at the left end of the support frame 20, and the image displayed on the display device 10 may be reflected by the reflection member 40 and provided to a user's left eye through the left lens 10*a*. Accordingly, the user can view the virtual reality image displayed on the display device 10 through the left eye. In some embodiments, the display device storage 50 may be disposed at both the left end and the right end of the support frame 20. In such embodiments, the user can view the virtual reality image displayed on the display device 10 through both the left eye and the right eye.

Referring to FIG. 25, the display device 10 according to one embodiment may be applied to the smart watch 2, that is, an example of a smart device.

Referring to FIG. 26, the display devices 10_*a*, 10_*b*, and 10_*c* according to one embodiment may be applied to the dashboard of the automobile, the center fascia of the automobile, and/or the center information display (CID) of the dashboard of the automobile. Further, the display devices 10_*d*, and 10_*e* according to one embodiment may be applied to a room (or interior) mirror display instead of side mirrors of the automobile.

Figure 27:
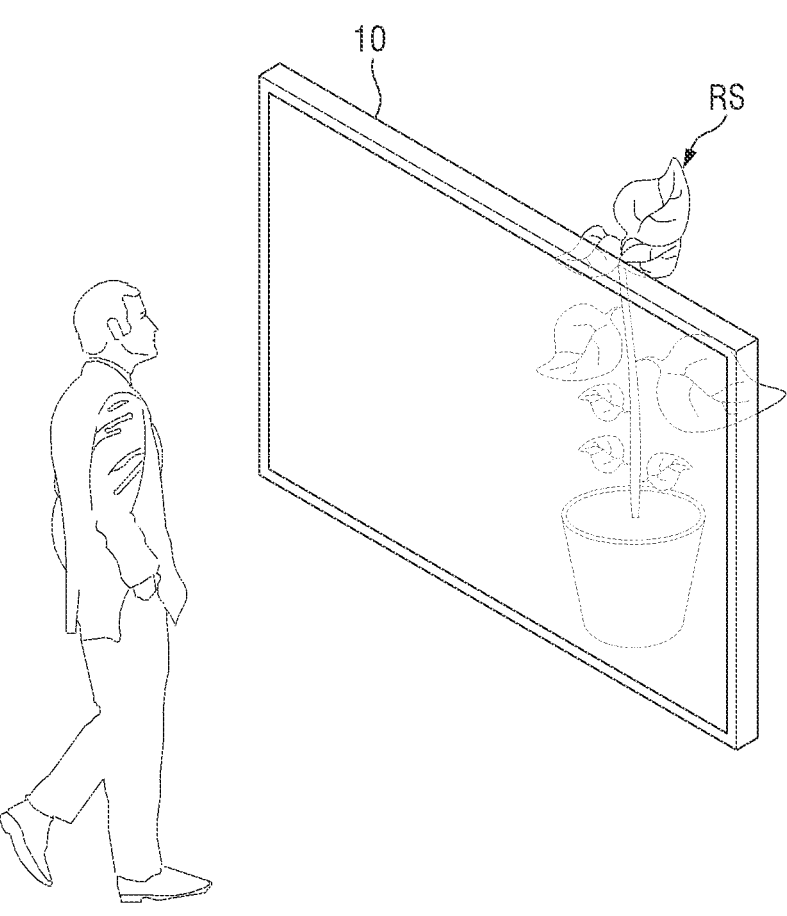
FIGS. 27 and 28 show a transparent display device including a display device according to one embodiment.
Figure 28:
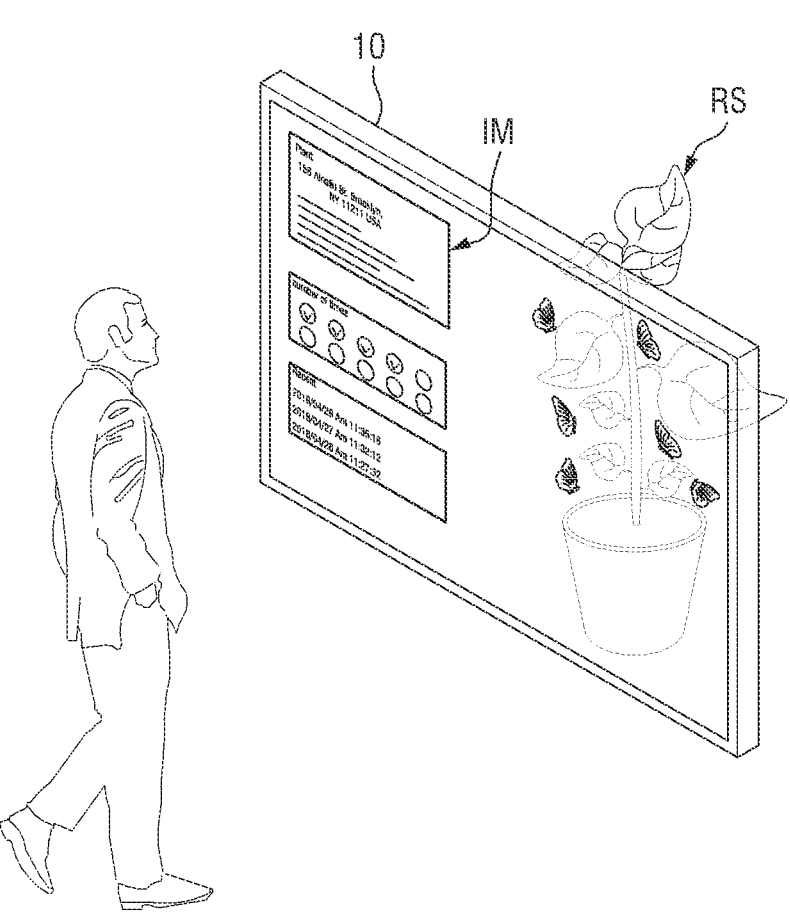

FIGS. 27 and 28 show a transparent display device including a display device according to one embodiment.

Referring to FIGS. 27 and 28, the display device 10 according to one embodiment may be applied to the transparent display device. The transparent display device may display an image IM and may also transmit light. A user located on the front side of the transparent display device can view an object RS or a background on the rear side of the transparent display device as well as the image IM displayed on the display device 10. When the display device 10 is applied to a transparent display device, the circuit substrate 100, the display substrate 300, the heat dissipation substrate 500, the cover substrate 700, and the circuit board CB of the display device 10 may include a light transmission portion configured to transmit light or may be formed of a material configured to transmit light.

In concluding the detailed description, those skilled in the art will appreciate that many variations and modifications can be made to the embodiments described herein without substantially departing from the present disclosure. Therefore, the disclosed embodiments of the present disclosure are used in a generic and descriptive sense and not for purposes of limitation.

What is claimed is:

1. A display device comprising:
a circuit substrate comprising a plurality of pixel circuit units and a plurality of pads on a first surface thereof, the plurality of pads being electrically connected to the pixel circuit units;

a display substrate on the circuit substrate and comprising a plurality of light emitting elements electrically connected to the pixel circuit units;

a circuit board on the circuit substrate and comprising a plurality of circuit board pads electrically connected to the pads;

a heat dissipation substrate on a second surface of the circuit substrate, the second surface being opposite to the first surface; and a cover substrate on the heat dissipation substrate and partially overlapping the circuit substrate and the circuit board, wherein each of the plurality of pads is in direct contact with at least one of the plurality of circuit board pads.

2. The display device of claim 1, wherein a portion of the cover substrate is on the second surface of the circuit board on which the circuit board pads are formed, and a physical interface exists between the pads and the circuit board pads.

3. The display device of claim 1, wherein the plurality of circuit board pads respectively corresponds to the plurality of pads, and the number of the circuit board pads is the same as the number of the pads.

4. The display device of claim 1, wherein the circuit board has an opening corresponding to the display substrate, and
wherein the display substrate is in the opening in the circuit substrate.

5. The display device of claim 4, wherein the cover substrate has an opening corresponding to the display substrate, and
wherein the display substrate protrudes from a top surface of the cover substrate.

6. The display device of claim 1, wherein each of the plurality of light emitting elements comprises a first semiconductor layer, an active layer on the first semiconductor layer, and a second semiconductor layer on the active layer, and
wherein the display substrate further comprises a third semiconductor layer, the second semiconductor layers of the light emitting elements being on one surface of the third semiconductor layer.

7. The display device of claim 6, wherein the second semiconductor layers of the plurality of light emitting elements are connected to each other through a base layer on the one surface of the third semiconductor layer, and
wherein the circuit substrate comprises a plurality of pixel electrodes overlapping the light emitting elements and a common electrode overlapping the base layer of the second semiconductor layer.

8. The display device of claim 1, wherein an area of the heat dissipation substrate is larger than an area of the circuit substrate, and
wherein the cover substrate has a first portion overlapping the pads and the circuit board pads and a second portion overlapping a portion of the heat dissipation substrate at where the circuit substrate is not disposed.

9. The display device of claim 8, further comprising a plurality of clamping parts,
wherein the cover substrate has a plurality of first holes in the second portion, and the heat dissipation substrate has a plurality of second holes respectively corresponding to the plurality of first holes, and
wherein the plurality of clamping parts are inserted into corresponding ones of the first holes and the second holes.

10. The display device of claim 8, further comprising an adhesive member between the second portion of the cover substrate and the heat dissipation substrate.

11. The display device of claim 1, further comprising a cushion layer between the cover substrate and the circuit board, wherein the cushion layer overlaps the plurality of pads and the plurality of circuit board pads.

12. The display device of claim 11, wherein the cushion layer comprises silicone, urethane, or acrylic rubber and a light blocking material.

13. The display device of claim 11, wherein the cover substrate comprises a plastic material or metal.

14. The display device of claim 11, further comprising a shielding layer between the cover substrate and the cushion layer, the shielding layer comprising a metal material.

15. A display device comprising:

a circuit substrate having a display area and a non-display area around the display area, the circuit substrate comprising a plurality of pads in the non-display area;

a display substrate on a first surface of the circuit substrate and comprising a plurality of light emitting elements in the display area;

a circuit board on one surface of the circuit substrate and having an opening corresponding to the display substrate, the circuit board comprising a plurality of circuit board pads corresponding to the pads and in direct contact with the pads;

a cushion layer on the circuit board and not overlapping the display substrate;

a cover substrate on the cushion layer and not overlapping the display substrate, the cover substrate having a plurality of first holes in a region that does not overlap the circuit board;

a heat dissipation substrate on a second surface of the circuit substrate, the second surface being opposite to the first surface, the heat dissipation substrate having a plurality of second holes corresponding to the plurality of first holes; and a plurality of clamping parts inserted into ones of the first holes and the second holes.

16. The display device of claim 15, further comprising a shielding layer between the cover substrate and the cushion layer, and wherein the shielding layer is made of a metal material.

17. The display device of claim 15, wherein each of the cover substrate and the heat dissipation substrate has a larger area than the circuit substrate, and wherein the cover substrate has an opening corresponding to the display substrate and has a portion overlapping the pads and the circuit board pads in a thickness direction.

18. The display device of claim 17, wherein the cushion layer overlaps the pads and the circuit board pads in a thickness direction.

19. The display device of claim 15, wherein the plurality of pads are on both sides of the display area, in the non-display area, in one direction, and wherein the circuit board pads are on both sides of the opening in the circuit board in the one direction.

20. The display device of claim 19, wherein the plurality of circuit board pads correspond to the plurality of pads, and wherein the number of the circuit board pads is the same as the number of the pads.

* * * * *